United States Patent
Zhang et al.

(10) Patent No.: US 10,622,538 B2
(45) Date of Patent: Apr. 14, 2020

(54) TECHNIQUES FOR PROVIDING A HAPTIC OUTPUT AND SENSING A HAPTIC INPUT USING A PIEZOELECTRIC BODY

(71) Applicant: Apple Inc., Cupertino, CA (US)

(72) Inventors: Zhipeng Zhang, Santa Clara, CA (US); Richard H. Koch, Cupertino, CA (US); Teera Songatikamas, San Jose, CA (US)

(73) Assignee: Apple Inc., Cupertino, CA (US)

( * ) Notice: Subject to any disclaimer, the term of this patent is extended or adjusted under 35 U.S.C. 154(b) by 116 days.

(21) Appl. No.: 15/653,468

(22) Filed: Jul. 18, 2017

(65) Prior Publication Data

US 2019/0027674 A1    Jan. 24, 2019

(51) Int. Cl.
*G06F 3/041* (2006.01)
*H01L 41/047* (2006.01)
(Continued)

(52) U.S. Cl.
CPC ........ *H01L 41/0472* (2013.01); *G06F 1/1643* (2013.01); *G06F 3/016* (2013.01);
(Continued)

(58) Field of Classification Search
None
See application file for complete search history.

(56) References Cited

U.S. PATENT DOCUMENTS

| 3,001,049 A | 9/1961 | Didier |
| 3,390,287 A | 6/1968 | Sonderegger |

(Continued)

FOREIGN PATENT DOCUMENTS

| AU | 2015100710 | 7/2015 |
| AU | 2016100399 | 5/2016 |

(Continued)

OTHER PUBLICATIONS

Aoki, et al., "Rolling-Shutter Distortion-Free 3D Stacked Image Sensor with -160dB Parasitic Light Sensitivity In-Pixel Storage Node," ISSCC 2013, Session 27, Image Sensors, 27.3 27.3 A, Feb. 20, 2013, retrieved on Apr. 11, 2014 from URL:http://ieeexplore.ieee.org/stamp/stamp.jsp?tp=&arnumber=6487824.

(Continued)

*Primary Examiner* — Carl Adams
(74) *Attorney, Agent, or Firm* — Brownstein Hyatt Farber Schreck, LLP

(57) ABSTRACT

Haptic interfaces are described. One haptic interface includes a piezoelectric body and first and second electrodes coupled to the piezoelectric body. The haptic interface also includes a control circuit. The control circuit includes a haptic actuator, a haptic sensor circuit, and an overcurrent protection circuit. The haptic actuator circuit is coupled to the first electrode and configured to charge the piezoelectric body. The charging causes the piezoelectric body to provide a haptic output. The haptic sensor circuit is coupled to the second electrode and configured to sense an electrical change at the second electrode. The electrical change is related to a haptic input received by the piezoelectric body. The overcurrent protection circuit is coupled to the second electrode and configured to limit a current flow into the haptic sensor circuit while the haptic actuator circuit is charging the piezoelectric body.

18 Claims, 15 Drawing Sheets

(51) Int. Cl.
    *H01L 41/083* (2006.01)
    *H01L 41/09* (2006.01)
    *G06F 3/0488* (2013.01)
    *G06F 3/01* (2006.01)
    *H01L 41/08* (2006.01)
    *H01L 41/04* (2006.01)
    *G06F 1/16* (2006.01)

(52) U.S. Cl.
    CPC ............ *G06F 3/041* (2013.01); *G06F 3/0412* (2013.01); *G06F 3/0416* (2013.01); *G06F 3/04886* (2013.01); *H01L 41/042* (2013.01); *H01L 41/083* (2013.01); *H01L 41/0825* (2013.01); *H01L 41/09* (2013.01); *G06F 2203/04103* (2013.01)

(56) References Cited

U.S. PATENT DOCUMENTS

| | | | |
|---|---|---|---|
| 3,419,739 A | 12/1968 | Clements |
| 4,236,132 A | 11/1980 | Zissimopoulos |
| 4,412,148 A | 10/1983 | Klicker et al. |
| 4,414,984 A | 11/1983 | Zarudiansky |
| 4,490,815 A | 12/1984 | Umehara et al. |
| 4,686,572 A | 8/1987 | Takatsu |
| 4,686,648 A | 8/1987 | Fossum |
| 4,695,813 A | 9/1987 | Nobutoki et al. |
| 4,975,616 A | 12/1990 | Park |
| 5,010,772 A | 4/1991 | Bourland |
| 5,105,264 A | 4/1992 | Erhardt et al. |
| 5,245,734 A | 9/1993 | Issartel |
| 5,283,408 A | 2/1994 | Chen |
| 5,293,161 A | 3/1994 | MacDonald et al. |
| 5,317,221 A | 5/1994 | Kubo et al. |
| 5,329,313 A | 7/1994 | Keith |
| 5,365,140 A | 11/1994 | Ohya et al. |
| 5,396,893 A | 3/1995 | Oberg et al. |
| 5,434,549 A | 7/1995 | Hirabayashi et al. |
| 5,436,622 A | 7/1995 | Gutman et al. |
| 5,471,515 A | 11/1995 | Fossum et al. |
| 5,510,584 A | 4/1996 | Norris |
| 5,510,783 A | 4/1996 | Findlater et al. |
| 5,513,100 A | 4/1996 | Parker et al. |
| 5,541,402 A | 7/1996 | Ackland |
| 5,550,677 A | 8/1996 | Schofield et al. |
| 5,587,875 A | 12/1996 | Sellers |
| 5,590,020 A | 12/1996 | Sellers |
| 5,602,715 A | 2/1997 | Lempicki et al. |
| 5,619,005 A | 4/1997 | Shibukawa et al. |
| 5,621,610 A | 4/1997 | Moore et al. |
| 5,625,532 A | 4/1997 | Sellers |
| 5,629,578 A | 5/1997 | Winzer et al. |
| 5,635,928 A | 6/1997 | Takagi et al. |
| 5,718,418 A | 2/1998 | Gugsch |
| 5,739,759 A | 4/1998 | Nakazawa et al. |
| 5,742,242 A | 4/1998 | Sellers |
| 5,781,312 A | 7/1998 | Noda |
| 5,783,765 A | 7/1998 | Muramatsu |
| 5,793,605 A | 8/1998 | Sellers |
| 5,812,116 A | 9/1998 | Malhi |
| 5,813,142 A | 9/1998 | Demon |
| 5,818,149 A | 10/1998 | Safari et al. |
| 5,841,126 A | 11/1998 | Fossum et al. |
| 5,880,459 A | 3/1999 | Pryor et al. |
| 5,896,076 A | 4/1999 | Van Namen |
| 5,907,199 A | 5/1999 | Miller |
| 5,949,483 A | 9/1999 | Fossum et al. |
| 5,951,908 A | 9/1999 | Cui et al. |
| 5,959,613 A | 9/1999 | Rosenberg et al. |
| 5,973,441 A | 10/1999 | Lo et al. |
| 5,982,304 A | 11/1999 | Selker et al. |
| 5,982,612 A | 11/1999 | Roylance |
| 5,995,026 A | 11/1999 | Sellers |
| 5,999,084 A | 12/1999 | Armstrong |
| 6,008,486 A | 12/1999 | Stam et al. |
| 6,035,257 A | 3/2000 | Epperson |
| 6,040,568 A | 3/2000 | Caulfield et al. |
| 6,069,433 A | 5/2000 | Lazarus et al. |
| 6,078,308 A | 6/2000 | Rosenberg et al. |
| 6,104,947 A | 8/2000 | Heikkila et al. |
| 6,127,756 A | 10/2000 | Iwaki |
| 6,135,886 A | 10/2000 | Armstrong |
| 6,198,206 B1 | 3/2001 | Saarmaa |
| 6,218,966 B1 | 4/2001 | Goodwin |
| 6,219,033 B1 | 4/2001 | Rosenberg |
| 6,220,550 B1 | 4/2001 | McKillip, Jr. |
| 6,222,525 B1 | 4/2001 | Armstrong |
| 6,233,013 B1 | 5/2001 | Hosier et al. |
| 6,252,336 B1 | 6/2001 | Hall |
| 6,342,880 B2 | 1/2002 | Rosenberg et al. |
| 6,348,929 B1 | 2/2002 | Acharya et al. |
| 6,351,205 B1 | 2/2002 | Armstrong |
| 6,373,465 B2 | 4/2002 | Jolly et al. |
| 6,408,187 B1 | 6/2002 | Merriam |
| 6,411,276 B1 | 6/2002 | Braun et al. |
| 6,429,849 B1 | 8/2002 | An |
| 6,437,485 B1 | 8/2002 | Johansson |
| 6,438,393 B1 | 8/2002 | Surronen |
| 6,444,928 B2 | 9/2002 | Okamoto et al. |
| 6,448,550 B1 | 9/2002 | Nishimura |
| 6,455,973 B1 | 9/2002 | Ineson |
| 6,465,921 B1 | 10/2002 | Horng |
| 6,528,833 B2 | 3/2003 | Lee et al. |
| 6,541,751 B1 | 4/2003 | Bidermann |
| 6,552,404 B1 | 4/2003 | Hynes |
| 6,552,471 B1 | 4/2003 | Chandran et al. |
| 6,557,072 B2 | 4/2003 | Osborn |
| 6,642,857 B1 | 11/2003 | Schediwy |
| 6,670,904 B1 | 12/2003 | Yakovlev |
| 6,693,626 B1 | 2/2004 | Rosenberg |
| 6,713,796 B1 | 3/2004 | Fox |
| 6,714,239 B2 | 3/2004 | Guidash |
| 6,717,573 B1 | 4/2004 | Shahoian et al. |
| 6,747,400 B2 | 6/2004 | Maichl et al. |
| 6,798,453 B1 | 9/2004 | Kaifu |
| 6,809,462 B2 | 10/2004 | Pelrine et al. |
| 6,809,727 B2 | 10/2004 | Piot et al. |
| 6,816,676 B2 | 11/2004 | Bianchi et al. |
| 6,864,877 B2 | 3/2005 | Braun et al. |
| 6,905,470 B2 | 6/2005 | Lee et al. |
| 6,906,697 B2 | 6/2005 | Rosenberg |
| 6,906,700 B1 | 6/2005 | Armstrong |
| 6,906,703 B2 | 6/2005 | Vablais et al. |
| 6,931,269 B2 | 8/2005 | Terry |
| 6,952,203 B2 | 10/2005 | Banerjee et al. |
| 6,954,657 B2 | 10/2005 | Bork et al. |
| 6,956,605 B1 | 10/2005 | Hashimoto |
| 6,963,762 B2 | 11/2005 | Kaaresoja et al. |
| 6,965,189 B2 | 11/2005 | Menzel |
| 6,982,759 B2 | 1/2006 | Goto |
| 6,995,752 B2 | 2/2006 | Lu |
| 7,005,811 B2 | 2/2006 | Wakuda et al. |
| 7,016,707 B2 | 3/2006 | Fujisawa et al. |
| 7,022,927 B2 | 4/2006 | Hsu |
| 7,023,112 B2 | 4/2006 | Miyamoto et al. |
| 7,075,049 B2 | 7/2006 | Rhodes et al. |
| 7,081,701 B2 | 7/2006 | Yoon et al. |
| 7,084,914 B2 | 8/2006 | Van Blerkom |
| 7,091,466 B2 | 8/2006 | Bock |
| 7,091,948 B2 | 8/2006 | Chang et al. |
| 7,119,322 B2 | 10/2006 | Hong |
| 7,121,147 B2 | 10/2006 | Okada |
| 7,123,948 B2 | 10/2006 | Nielsen |
| 7,130,664 B1 | 10/2006 | Williams |
| 7,133,073 B1 | 11/2006 | Neter |
| 7,136,045 B2 | 11/2006 | Rosenberg et al. |
| 7,158,122 B2 | 1/2007 | Roberts |
| 7,161,580 B2 | 1/2007 | Bailey et al. |
| 7,162,928 B2 | 1/2007 | Shank et al. |
| 7,170,498 B2 | 1/2007 | Huang |
| 7,176,906 B2 | 2/2007 | Williams et al. |
| 7,180,500 B2 | 2/2007 | Marvit et al. |
| 7,182,691 B1 | 2/2007 | Schena |
| 7,194,645 B2 | 3/2007 | Bieswanger et al. |

(56) References Cited

U.S. PATENT DOCUMENTS

| | | |
|---|---|---|
| 7,205,978 B2 | 4/2007 | Poupyrev |
| 7,217,891 B2 | 5/2007 | Fischer et al. |
| 7,218,310 B2 | 5/2007 | Tierling et al. |
| 7,219,561 B2 | 5/2007 | Okada |
| 7,253,350 B2 | 8/2007 | Noro et al. |
| 7,259,413 B2 | 8/2007 | Rhodes |
| 7,262,401 B2 | 8/2007 | Hopper et al. |
| 7,269,484 B2 | 9/2007 | Hein |
| 7,271,835 B2 | 9/2007 | Iizuka |
| 7,282,028 B2 | 10/2007 | Kim et al. |
| 7,319,218 B2 | 1/2008 | Krymski |
| 7,332,786 B2 | 2/2008 | Altice |
| 7,333,604 B2 | 2/2008 | Zernovizky et al. |
| 7,334,350 B2 | 2/2008 | Ellis |
| 7,348,968 B2 | 3/2008 | Dawson |
| 7,382,357 B2 | 6/2008 | Panotopoulos et al. |
| 7,388,741 B2 | 6/2008 | Konuma et al. |
| 7,390,687 B2 | 6/2008 | Boettiger |
| 7,392,066 B2 | 6/2008 | Hapamas |
| 7,415,096 B2 | 8/2008 | Sherman |
| 7,423,631 B2 | 9/2008 | Shahoian et al. |
| 7,437,013 B2 | 10/2008 | Anderson |
| 7,443,421 B2 | 10/2008 | Stavely et al. |
| 7,446,752 B2 | 11/2008 | Goldenberg et al. |
| 7,446,812 B2 | 11/2008 | Ando et al. |
| 7,469,155 B2 | 12/2008 | Chu |
| 7,469,595 B2 | 12/2008 | Kessler et al. |
| 7,471,033 B2 | 12/2008 | Thiesen et al. |
| 7,471,315 B2 | 12/2008 | Silsby et al. |
| 7,495,358 B2 | 2/2009 | Kobayashi et al. |
| 7,502,054 B2 | 3/2009 | Kalapathy |
| 7,508,382 B2 | 3/2009 | Denoue et al. |
| 7,525,168 B2 | 4/2009 | Hsieh |
| 7,554,067 B2 | 6/2009 | Zarnoski et al. |
| 7,555,158 B2 | 6/2009 | Park et al. |
| 7,561,142 B2 | 7/2009 | Shahoian et al. |
| 7,562,468 B2 | 7/2009 | Ellis |
| 7,569,086 B2 | 8/2009 | Chandran |
| 7,575,368 B2 | 8/2009 | Guillaume |
| 7,586,220 B2 | 9/2009 | Roberts |
| 7,589,316 B2 | 9/2009 | Dunki-Jacobs |
| 7,619,498 B2 | 11/2009 | Miura |
| 7,622,699 B2 | 11/2009 | Sakakibara et al. |
| 7,626,626 B2 | 12/2009 | Panicacci |
| 7,636,109 B2 | 12/2009 | Nakajima et al. |
| 7,639,232 B2 | 12/2009 | Grant et al. |
| 7,641,618 B2 | 1/2010 | Noda et al. |
| 7,647,196 B2 | 1/2010 | Kahn et al. |
| 7,649,305 B2 | 1/2010 | Priya et al. |
| 7,667,400 B1 | 2/2010 | Goushcha |
| 7,671,435 B2 | 3/2010 | Ahn |
| 7,675,253 B2 | 3/2010 | Dorel |
| 7,675,414 B2 | 3/2010 | Ray |
| 7,679,611 B2 | 3/2010 | Schena |
| 7,707,742 B2 | 5/2010 | Ellis |
| 7,710,399 B2 | 5/2010 | Bruneau et al. |
| 7,714,292 B2 | 5/2010 | Agarwal et al. |
| 7,728,351 B2 | 6/2010 | Shim |
| 7,732,951 B2 | 6/2010 | Mukaide |
| 7,733,402 B2 | 6/2010 | Egawa et al. |
| 7,737,828 B2 | 6/2010 | Yang et al. |
| 7,742,036 B2 | 6/2010 | Grant et al. |
| 7,742,090 B2 | 6/2010 | Street |
| 7,764,312 B2 | 7/2010 | Ono et al. |
| 7,773,138 B2 | 8/2010 | Lahav et al. |
| 7,786,543 B2 | 8/2010 | Hsieh |
| 7,788,032 B2 | 8/2010 | Moloney |
| 7,793,429 B2 | 9/2010 | Ellis |
| 7,793,430 B2 | 9/2010 | Ellis |
| 7,796,171 B2 | 9/2010 | Gardner |
| 7,798,982 B2 | 9/2010 | Zets et al. |
| 7,817,198 B2 | 10/2010 | Kang et al. |
| 7,838,956 B2 | 11/2010 | McCarten et al. |
| 7,868,489 B2 | 1/2011 | Amemiya et al. |
| 7,873,236 B2 | 1/2011 | Li et al. |
| 7,880,785 B2 | 2/2011 | Gallagher |
| 7,884,402 B2 | 2/2011 | Ki |
| 7,886,621 B2 | 2/2011 | Smith et al. |
| 7,888,892 B2 | 2/2011 | McReynolds et al. |
| 7,893,922 B2 | 2/2011 | Klinghult et al. |
| 7,906,826 B2 | 3/2011 | Martin et al. |
| 7,919,945 B2 | 4/2011 | Houston et al. |
| 7,929,382 B2 | 4/2011 | Yamazaki |
| 7,946,483 B2 | 5/2011 | Miller et al. |
| 7,952,121 B2 | 5/2011 | Arimoto |
| 7,952,261 B2 | 5/2011 | Lipton et al. |
| 7,952,566 B2 | 5/2011 | Poupyrev et al. |
| 7,952,635 B2 | 5/2011 | Lauxtermann |
| 7,956,770 B2 | 6/2011 | Klinghult et al. |
| 7,961,909 B2 | 6/2011 | Mandella et al. |
| 7,982,789 B2 | 7/2011 | Watanabe et al. |
| 8,018,105 B2 | 9/2011 | Erixon et al. |
| 8,026,966 B2 | 9/2011 | Altice |
| 8,031,172 B2 | 10/2011 | Kruse et al. |
| 8,032,206 B1 | 10/2011 | Farazi et al. |
| 8,044,940 B2 | 10/2011 | Narusawa |
| 8,069,881 B1 | 12/2011 | Cunha |
| 8,072,418 B2 | 12/2011 | Crawford et al. |
| 8,077,145 B2 | 12/2011 | Rosenberg et al. |
| 8,081,156 B2 | 12/2011 | Ruettiger |
| 8,082,640 B2 | 12/2011 | Takeda |
| 8,084,968 B2 | 12/2011 | Murray et al. |
| 8,089,036 B2 | 1/2012 | Manabe et al. |
| 8,089,524 B2 | 1/2012 | Urisaka |
| 8,094,232 B2 | 1/2012 | Kusaka |
| 8,098,234 B2 | 1/2012 | Lacroix et al. |
| 8,116,540 B2 | 2/2012 | Dean |
| 8,123,660 B2 | 2/2012 | Kruse et al. |
| 8,125,453 B2 | 2/2012 | Shahoian et al. |
| 8,140,143 B2 | 3/2012 | Picard et al. |
| 8,141,276 B2 | 3/2012 | Ellis |
| 8,153,947 B2 | 4/2012 | Barbier et al. |
| 8,156,809 B2 | 4/2012 | Tierling et al. |
| 8,159,570 B2 | 4/2012 | Negishi |
| 8,159,588 B2 | 4/2012 | Boemler |
| 8,164,669 B2 | 4/2012 | Compton et al. |
| 8,169,401 B2 | 5/2012 | Hardwick |
| 8,174,344 B2 | 5/2012 | Yakima et al. |
| 8,174,372 B2 | 5/2012 | da Costa |
| 8,174,595 B2 | 5/2012 | Honda et al. |
| 8,179,027 B2 | 5/2012 | Barta et al. |
| 8,179,202 B2 | 5/2012 | Cruz-Hernandez et al. |
| 8,184,188 B2 | 5/2012 | Yaghmai |
| 8,188,623 B2 | 5/2012 | Park |
| 8,194,148 B2 | 6/2012 | Doida |
| 8,194,165 B2 | 6/2012 | Border et al. |
| 8,205,356 B2 | 6/2012 | Ellis |
| 8,210,942 B2 | 7/2012 | Shimabukuro et al. |
| 8,222,586 B2 | 7/2012 | Lee |
| 8,227,844 B2 | 7/2012 | Adkisson |
| 8,232,494 B2 | 7/2012 | Purcocks |
| 8,233,071 B2 | 7/2012 | Takeda |
| 8,242,641 B2 | 8/2012 | Bae |
| 8,248,277 B2 | 8/2012 | Peterson et al. |
| 8,248,278 B2 | 8/2012 | Schlosser et al. |
| 8,253,686 B2 | 8/2012 | Kyung et al. |
| 8,255,004 B2 | 8/2012 | Huang et al. |
| 8,259,228 B2 | 9/2012 | Wei et al. |
| 8,261,468 B2 | 9/2012 | Ellis |
| 8,264,465 B2 | 9/2012 | Grant et al. |
| 8,270,114 B2 | 9/2012 | Argumedo et al. |
| 8,270,148 B2 | 9/2012 | Griffith et al. |
| 8,288,899 B2 | 10/2012 | Park et al. |
| 8,291,614 B2 | 10/2012 | Ellis |
| 8,294,600 B2 | 10/2012 | Peterson et al. |
| 8,310,577 B1 | 11/2012 | Neter |
| 8,315,746 B2 | 11/2012 | Cox et al. |
| 8,324,553 B2 | 12/2012 | Lee |
| 8,338,856 B2 | 12/2012 | Tai et al. |
| 8,339,250 B2 | 12/2012 | Je et al. |
| 8,340,407 B2 | 12/2012 | Kalman |
| 8,344,834 B2 | 1/2013 | Niiyama |
| 8,345,013 B2 | 1/2013 | Heubel et al. |
| 8,350,940 B2 | 1/2013 | Smith et al. |

(56) References Cited

U.S. PATENT DOCUMENTS

| | | |
|---|---|---|
| 8,355,117 B2 | 1/2013 | Niclass |
| 8,373,549 B2 | 2/2013 | Fadell et al. |
| 8,378,797 B2 | 2/2013 | Pance et al. |
| 8,378,798 B2 | 2/2013 | Bells et al. |
| 8,378,965 B2 | 2/2013 | Gregorio et al. |
| 8,384,316 B2 | 2/2013 | Houston et al. |
| 8,384,679 B2 | 2/2013 | Paleczny et al. |
| 8,388,346 B2 | 3/2013 | Rantala et al. |
| 8,390,594 B2 | 3/2013 | Modarres et al. |
| 8,395,587 B2 | 3/2013 | Cauwels et al. |
| 8,398,570 B2 | 3/2013 | Mortimer et al. |
| 8,400,546 B2 | 3/2013 | Itano et al. |
| 8,405,618 B2 | 3/2013 | Colgate et al. |
| 8,411,058 B2 | 4/2013 | Wong et al. |
| 8,446,264 B2 | 5/2013 | Tanase |
| 8,451,255 B2 | 5/2013 | Weber et al. |
| 8,452,345 B2 | 5/2013 | Lee et al. |
| 8,456,540 B2 | 6/2013 | Egawa |
| 8,456,559 B2 | 6/2013 | Yamashita |
| 8,461,951 B2 | 6/2013 | Gassmann et al. |
| 8,466,889 B2 | 6/2013 | Tong et al. |
| 8,471,690 B2 | 6/2013 | Hennig et al. |
| 8,487,759 B2 | 7/2013 | Hill |
| 8,508,637 B2 | 8/2013 | Han et al. |
| 8,514,308 B2 | 8/2013 | Itonaga et al. |
| 8,515,398 B2 | 8/2013 | Song et al. |
| 8,520,913 B2 | 8/2013 | Dean |
| 8,542,134 B2 | 9/2013 | Peterson et al. |
| 8,545,322 B2 | 10/2013 | George et al. |
| 8,546,737 B2 | 10/2013 | Tian et al. |
| 8,547,341 B2 | 10/2013 | Takashima et al. |
| 8,547,350 B2 | 10/2013 | Anglin et al. |
| 8,547,388 B2 | 10/2013 | Cheng |
| 8,552,859 B2 | 10/2013 | Pakula et al. |
| 8,570,291 B2 | 10/2013 | Motomura |
| 8,575,531 B2 | 11/2013 | Hynecek et al. |
| 8,575,794 B2 | 11/2013 | Lee et al. |
| 8,581,992 B2 | 11/2013 | Hamada |
| 8,587,955 B2 | 11/2013 | DiFonzo et al. |
| 8,593,409 B1 | 11/2013 | Heubel |
| 8,594,170 B2 | 11/2013 | Mombers et al. |
| 8,598,893 B2 | 12/2013 | Camus |
| 8,599,047 B2 | 12/2013 | Schlosser et al. |
| 8,599,152 B1 | 12/2013 | Wurtenberger et al. |
| 8,600,354 B2 | 12/2013 | Esaki |
| 8,614,431 B2 | 12/2013 | Huppi et al. |
| 8,619,163 B2 | 12/2013 | Ogua |
| 8,619,170 B2 | 12/2013 | Mabuchi |
| 8,621,348 B2 | 12/2013 | Ramsay et al. |
| 8,629,484 B2 | 1/2014 | Ohri et al. |
| 8,629,843 B2 | 1/2014 | Steeves et al. |
| 8,633,916 B2 | 1/2014 | Bernstein et al. |
| 8,634,002 B2 | 1/2014 | Kita |
| 8,637,875 B2 | 1/2014 | Finkelstein et al. |
| 8,648,947 B2 | 2/2014 | Sato et al. |
| 8,653,434 B2 | 2/2014 | Johnson et al. |
| 8,674,941 B2 | 3/2014 | Casparian et al. |
| 8,680,723 B2 | 3/2014 | Subramanian |
| 8,681,092 B2 | 3/2014 | Harada et al. |
| 8,682,396 B2 | 3/2014 | Yang et al. |
| 8,686,952 B2 | 4/2014 | Burrough et al. |
| 8,710,966 B2 | 4/2014 | Hill |
| 8,717,309 B2 | 5/2014 | Almalki |
| 8,723,813 B2 | 5/2014 | Park et al. |
| 8,723,975 B2 | 5/2014 | Solhusvik |
| 8,724,096 B2 | 5/2014 | Gosch et al. |
| 8,730,345 B2 | 5/2014 | Watanabe |
| 8,733,540 B2 | 5/2014 | Woiler et al. |
| 8,735,755 B2 | 5/2014 | Peterson et al. |
| 8,754,983 B2 | 6/2014 | Sutton |
| 8,755,854 B2 | 6/2014 | Addison et al. |
| 8,759,736 B2 | 6/2014 | Yoo |
| 8,760,273 B2 | 6/2014 | Casparian et al. |
| 8,760,413 B2 | 6/2014 | Peterson et al. |
| 8,767,104 B2 | 7/2014 | Makino et al. |
| 8,780,060 B2 | 7/2014 | Maschmeyer et al. |
| 8,787,006 B2 | 7/2014 | Golko et al. |
| 8,797,152 B2 | 8/2014 | Henderson et al. |
| 8,798,534 B2 | 8/2014 | Rodriguez et al. |
| 8,803,842 B2 | 8/2014 | Wakasugi et al. |
| 8,803,990 B2 | 8/2014 | Smith |
| 8,810,703 B2 | 8/2014 | Mabuchi |
| 8,816,981 B2 | 8/2014 | Kai et al. |
| 8,817,154 B2 | 8/2014 | Manabe et al. |
| 8,836,502 B2 | 9/2014 | Culbert et al. |
| 8,857,248 B2 | 10/2014 | Shih et al. |
| 8,860,562 B2 | 10/2014 | Hill |
| 8,861,776 B2 | 10/2014 | Lastrucci |
| 8,866,600 B2 | 10/2014 | Yang et al. |
| 8,879,686 B2 | 11/2014 | Okada et al. |
| 8,890,666 B2 | 11/2014 | Parker et al. |
| 8,890,668 B2 | 11/2014 | Pance et al. |
| 8,902,330 B2 | 12/2014 | Theuwissen |
| 8,902,341 B2 | 12/2014 | Machida |
| 8,908,073 B2 | 12/2014 | Minagawa |
| 8,918,215 B2 | 12/2014 | Bosscher et al. |
| 8,923,994 B2 | 12/2014 | Laikari et al. |
| 8,928,621 B2 | 1/2015 | Ciesla et al. |
| 8,934,030 B2 | 1/2015 | Kim et al. |
| 8,936,552 B2 | 1/2015 | Kateraas et al. |
| 8,946,610 B2 | 2/2015 | Iwabuchi et al. |
| 8,947,383 B2 | 2/2015 | Ciesla et al. |
| 8,948,821 B2 | 2/2015 | Newham et al. |
| 8,952,937 B2 | 2/2015 | Shih et al. |
| 8,970,534 B2 | 3/2015 | Adachi et al. |
| 8,976,141 B2 | 3/2015 | Myers et al. |
| 8,982,237 B2 | 3/2015 | Chen |
| 9,006,641 B2 | 4/2015 | Drader |
| 9,008,730 B2 | 4/2015 | Kim et al. |
| 9,012,795 B2 | 4/2015 | Niu |
| 9,013,426 B2 | 4/2015 | Cole et al. |
| 9,019,088 B2 | 4/2015 | Zawacki et al. |
| 9,024,738 B2 | 5/2015 | Van Schyndel et al. |
| 9,035,887 B1 | 5/2015 | Prud'Hommeaux et al. |
| 9,041,837 B2 | 5/2015 | Li |
| 9,017,748 B2 | 6/2015 | Theuwissen |
| 9,054,009 B2 | 6/2015 | Oike et al. |
| 9,058,081 B2 | 6/2015 | Baxter |
| 9,066,017 B2 | 6/2015 | Geiss |
| 9,066,660 B2 | 6/2015 | Watson et al. |
| 9,072,576 B2 | 7/2015 | Nishiura |
| 9,083,821 B2 | 7/2015 | Hughes |
| 9,088,727 B2 | 7/2015 | Trumbo |
| 9,092,129 B2 | 7/2015 | Abdo et al. |
| 9,094,623 B2 | 7/2015 | Kawaguchi |
| 9,098,984 B2 | 8/2015 | Heubel et al. |
| 9,098,991 B2 | 8/2015 | Park et al. |
| 9,099,604 B2 | 8/2015 | Roy |
| 9,100,597 B2 | 8/2015 | Hu |
| 9,106,859 B2 | 8/2015 | Kizuna et al. |
| 9,117,347 B2 | 8/2015 | Matthews |
| 9,122,325 B2 | 9/2015 | Peshkin et al. |
| 9,131,039 B2 | 9/2015 | Behles |
| 9,131,171 B2 | 9/2015 | Aoki et al. |
| 9,134,834 B2 | 9/2015 | Reshef |
| 9,141,225 B2 | 9/2015 | Cok et al. |
| 9,151,829 B2 | 10/2015 | Campbell |
| 9,154,750 B2 | 10/2015 | Pang |
| 9,158,379 B2 | 10/2015 | Cruz-Hernandez et al. |
| 9,160,949 B2 | 10/2015 | Zhang et al. |
| 9,164,144 B2 | 10/2015 | Dolinsky |
| 9,178,100 B2 | 11/2015 | Webster et al. |
| 9,178,509 B2 | 11/2015 | Bernstein |
| 9,189,932 B2 | 11/2015 | Kerdemelidis et al. |
| 9,201,458 B2 | 12/2015 | Hunt et al. |
| 9,202,355 B2 | 12/2015 | Hill |
| 9,209,320 B1 | 12/2015 | Webster |
| 9,219,401 B2 | 12/2015 | Kim et al. |
| 9,225,948 B2 | 12/2015 | Hasegawa |
| 9,232,150 B2 | 1/2016 | Kleekajai et al. |
| 9,232,161 B2 | 1/2016 | Suh |
| 9,235,267 B2 | 1/2016 | Pope et al. |
| 9,270,906 B2 | 2/2016 | Peng et al. |
| 9,274,601 B2 | 3/2016 | Faubert et al. |

(56) References Cited

U.S. PATENT DOCUMENTS

| | | |
|---|---|---|
| 9,274,602 B2 | 3/2016 | Garg et al. |
| 9,274,603 B2 | 3/2016 | Modarres et al. |
| 9,275,815 B2 | 3/2016 | Hoffmann |
| 9,276,031 B2 | 3/2016 | Wan |
| 9,277,144 B2 | 3/2016 | Kleekajai et al. |
| 9,285,923 B2 | 3/2016 | Liao et al. |
| 9,287,304 B2 | 3/2016 | Park et al. |
| 9,288,380 B2 | 3/2016 | Nomura |
| 9,288,404 B2 | 3/2016 | Papiashvili |
| 9,293,054 B2 | 3/2016 | Bruni et al. |
| 9,293,500 B2 | 3/2016 | Sharma et al. |
| 9,300,181 B2 | 3/2016 | Maeda et al. |
| 9,310,906 B2 | 4/2016 | Yumiki et al. |
| 9,310,950 B2 | 4/2016 | Takano et al. |
| 9,312,401 B2 | 4/2016 | Webster |
| 9,313,434 B2 | 4/2016 | Dutton et al. |
| 9,317,116 B2 | 4/2016 | Ullrich et al. |
| 9,317,118 B2 | 4/2016 | Puskarich |
| 9,317,154 B2 | 4/2016 | Perlin et al. |
| 9,318,942 B2 | 4/2016 | Sugita et al. |
| 9,319,611 B2 | 4/2016 | Fan |
| 9,325,230 B2 | 4/2016 | Yamada et al. |
| 9,330,544 B2 | 5/2016 | Levesque et al. |
| 9,331,116 B2 | 5/2016 | Webster |
| 9,344,649 B2 | 5/2016 | Bock |
| 9,357,052 B2 | 5/2016 | Ullrich |
| 9,360,944 B2 | 6/2016 | Pinault |
| 9,367,238 B2 | 6/2016 | Tanada |
| 9,380,145 B2 | 6/2016 | Tartz et al. |
| 9,380,245 B1 | 6/2016 | Guidash |
| 9,390,599 B2 | 7/2016 | Weinberg |
| 9,392,237 B2 | 7/2016 | Toyoda |
| 9,396,434 B2 | 7/2016 | Rothkopf |
| 9,405,369 B2 | 8/2016 | Modarres et al. |
| 9,411,423 B2 | 8/2016 | Heubel |
| 9,417,326 B2 | 8/2016 | Niclass et al. |
| 9,417,695 B2 | 8/2016 | Griffin et al. |
| 9,430,042 B2 | 8/2016 | Levin |
| 9,438,258 B1 | 9/2016 | Yoo |
| 9,445,018 B2 | 9/2016 | Fettig et al. |
| 9,448,110 B2 | 9/2016 | Wong |
| 9,448,628 B2 | 9/2016 | Tan et al. |
| 9,448,713 B2 | 9/2016 | Cruz-Hernandez et al. |
| 9,449,476 B2 | 9/2016 | Lynn |
| 9,451,887 B2 | 9/2016 | Watson et al. |
| 9,452,268 B2 | 9/2016 | Badaye et al. |
| 9,454,239 B2 | 9/2016 | Elias et al. |
| 9,467,033 B2 | 10/2016 | Jun et al. |
| 9,467,553 B2 | 10/2016 | Heo et al. |
| 9,468,846 B2 | 10/2016 | Terrell et al. |
| 9,471,172 B2 | 10/2016 | Sirois |
| 9,473,706 B2 | 10/2016 | Malone et al. |
| 9,477,342 B2 | 10/2016 | Daverman et al. |
| 9,478,030 B1 | 10/2016 | Lecky |
| 9,479,688 B2 | 10/2016 | Ishii |
| 9,480,947 B2 | 11/2016 | Jiang et al. |
| 9,490,285 B2 | 11/2016 | Itonaga |
| 9,497,397 B1 | 11/2016 | Kleekajai et al. |
| 9,501,912 B1 | 11/2016 | Havskjold et al. |
| 9,503,616 B2 | 11/2016 | Taniguchi et al. |
| 9,516,244 B2 | 12/2016 | Borowski |
| 9,538,106 B2 | 1/2017 | McMahon et al. |
| 9,542,028 B2 | 1/2017 | Filiz et al. |
| 9,544,694 B2 | 1/2017 | Abe et al. |
| 9,549,099 B2 | 1/2017 | Fan |
| 9,560,339 B2 | 1/2017 | Borowski |
| 9,564,029 B2 | 2/2017 | Morrell et al. |
| 9,576,445 B2 | 2/2017 | Cruz-Hernandez |
| 9,584,743 B1 | 2/2017 | Lin et al. |
| 9,595,659 B2 | 3/2017 | Kim |
| 9,596,420 B2 | 3/2017 | Fan et al. |
| 9,596,423 B1 | 3/2017 | Molgaard |
| 9,600,070 B2 | 3/2017 | Chatterjee et al. |
| 9,608,506 B2 | 3/2017 | Degner et al. |
| 9,622,214 B2 | 4/2017 | Ryu |
| 9,639,063 B2 | 5/2017 | Dutton et al. |
| 9,640,048 B2 | 5/2017 | Hill |
| 9,652,040 B2 | 5/2017 | Martinez et al. |
| 9,659,482 B2 | 5/2017 | Yang et al. |
| 9,661,308 B1 | 5/2017 | Wang et al. |
| 9,665,198 B2 | 5/2017 | Kies et al. |
| 9,686,485 B2 | 6/2017 | Agranov et al. |
| 9,692,286 B2 | 6/2017 | Endo et al. |
| 9,594,450 B2 | 7/2017 | Lynn et al. |
| 9,696,803 B2 | 7/2017 | Curz-Hernandez et al. |
| 9,700,240 B2 | 7/2017 | Letchner et al. |
| 9,727,157 B2 | 8/2017 | Ham et al. |
| 9,733,704 B2 | 8/2017 | Cruz-Hernandez et al. |
| 9,741,754 B2 | 8/2017 | Li et al. |
| 9,746,945 B2 | 8/2017 | Sheynblat et al. |
| 9,749,556 B2 | 8/2017 | Fettig et al. |
| 9,774,318 B2 | 9/2017 | Song |
| 9,778,743 B2 | 10/2017 | Grant et al. |
| 9,779,592 B1 | 10/2017 | Hoen |
| 9,781,368 B2 | 10/2017 | Song |
| 9,785,251 B2 | 10/2017 | Martisauskas |
| 9,823,833 B2 | 11/2017 | Grant et al. |
| 9,830,782 B2 | 11/2017 | Morrell et al. |
| 9,831,283 B2 | 11/2017 | Shepard et al. |
| 9,831,871 B2 | 11/2017 | Lee et al. |
| 9,836,123 B2 | 12/2017 | Gipson et al. |
| 9,846,484 B2 | 12/2017 | Shah |
| 9,857,872 B2 | 1/2018 | Terlizzi et al. |
| 9,870,053 B2 | 1/2018 | Modarres et al. |
| 9,886,093 B2 | 2/2018 | Moussette et al. |
| 9,888,198 B2 | 2/2018 | Mauritzson et al. |
| 9,891,708 B2 | 2/2018 | Cruz-Hernandez et al. |
| 9,894,304 B1 | 2/2018 | Smith |
| 9,904,393 B2 | 2/2018 | Frey et al. |
| 9,911,553 B2 | 3/2018 | Bernstein |
| 9,912,883 B1 | 3/2018 | Agranov et al. |
| 9,928,950 B2 | 3/2018 | Lubinski et al. |
| 9,934,661 B2 | 4/2018 | Hill |
| 9,952,323 B2 | 4/2018 | Deane |
| 9,970,757 B2 | 5/2018 | Das et al. |
| 9,990,099 B2 | 6/2018 | Ham et al. |
| 9,997,306 B2 | 6/2018 | Bernstein |
| 10,013,058 B2 | 7/2018 | Puskarich et al. |
| 10,032,550 B1 | 7/2018 | Zhang |
| 10,038,361 B2 | 7/2018 | Hajati et al. |
| 10,039,080 B2 | 7/2018 | Miller et al. |
| 10,061,386 B2 | 8/2018 | Frescas et al. |
| 10,062,832 B2 | 8/2018 | Caraveo et al. |
| 10,067,585 B2 | 9/2018 | Kim |
| 10,069,392 B2 | 9/2018 | Degner et al. |
| 10,120,446 B2 | 11/2018 | Pence et al. |
| 10,126,817 B2 | 11/2018 | Morrell et al. |
| 10,127,778 B2 | 11/2018 | Hajati et al. |
| 10,133,352 B2 | 11/2018 | Lee et al. |
| 10,136,090 B2 | 11/2018 | Vogelsang et al. |
| 10,139,907 B2 | 11/2018 | Billington |
| 10,139,959 B2 | 11/2018 | Butler et al. |
| 10,152,116 B2 | 12/2018 | Wang et al. |
| 10,153,310 B2 | 12/2018 | Zhang et al. |
| 10,198,097 B2 | 2/2019 | Lynn et al. |
| 10,204,494 B2 | 2/2019 | Do et al. |
| 10,236,760 B2 | 3/2019 | Moussette et al. |
| 10,268,272 B2 | 4/2019 | Chen |
| 10,276,001 B2 | 4/2019 | Smith et al. |
| 10,285,626 B1 | 5/2019 | Kestelli et al. |
| 10,289,199 B2 | 5/2019 | Hoellwarth et al. |
| 10,338,682 B2 | 7/2019 | Heubel et al. |
| 10,345,905 B2 | 7/2019 | McClure et al. |
| 10,353,467 B2 | 7/2019 | Augenbergs et al. |
| 10,367,950 B2 | 7/2019 | Davis et al. |
| 10,372,250 B2 | 8/2019 | Zhang et al. |
| 10,416,811 B2 | 9/2019 | Abdollahian et al. |
| 10,423,214 B2 | 9/2019 | Mistry et al. |
| 10,429,929 B2 | 10/2019 | Sulem et al. |
| 10,444,841 B2 | 10/2019 | Nakamura et al. |
| 10,456,622 B2 | 10/2019 | Szabados et al. |
| 10,459,521 B2 | 10/2019 | Puskarich |
| 10,481,691 B2 | 11/2019 | Utterman et al. |
| 10,481,692 B2 | 11/2019 | Ullrich et al. |

(56) References Cited

U.S. PATENT DOCUMENTS

| | | |
|---|---|---|
| 10,490,035 B2 | 11/2019 | Morrell et al. |
| 2002/0194284 A1 | 12/2002 | Haynes |
| 2003/0036685 A1 | 2/2003 | Goodman et al. |
| 2003/0210259 A1 | 11/2003 | Liu |
| 2004/0021663 A1 | 2/2004 | Suzuki et al. |
| 2004/0127198 A1 | 7/2004 | Roskind et al. |
| 2004/0207836 A1 | 10/2004 | Chhibber et al. |
| 2005/0026332 A1 | 2/2005 | Fratti et al. |
| 2005/0057528 A1 | 3/2005 | Kleen |
| 2005/0107129 A1 | 5/2005 | Kaewell et al. |
| 2005/0110778 A1 | 5/2005 | Ben Ayed |
| 2005/0118922 A1 | 6/2005 | Endo |
| 2005/0217142 A1 | 10/2005 | Ellis |
| 2005/0237306 A1 | 10/2005 | Klein et al. |
| 2005/0248549 A1 | 11/2005 | Dietz et al. |
| 2005/0258715 A1 | 11/2005 | Schlabach |
| 2006/0014569 A1 | 1/2006 | DelGiorno |
| 2006/0154674 A1 | 7/2006 | Landschaft et al. |
| 2006/0209037 A1 | 9/2006 | Wang et al. |
| 2006/0239746 A1 | 10/2006 | Grant |
| 2006/0252463 A1 | 11/2006 | Liao |
| 2006/0274161 A1 | 12/2006 | Ing et al. |
| 2007/0032270 A1 | 2/2007 | Orr |
| 2007/0043725 A1 | 2/2007 | Hotelling et al. |
| 2007/0099574 A1 | 5/2007 | Wang |
| 2007/0152974 A1 | 7/2007 | Kim et al. |
| 2007/0168430 A1 | 7/2007 | Brun et al. |
| 2007/0178942 A1 | 8/2007 | Sadler et al. |
| 2007/0188450 A1 | 8/2007 | Hernandez et al. |
| 2007/0263099 A1 | 11/2007 | Motta et al. |
| 2008/0084384 A1 | 4/2008 | Gregorio et al. |
| 2008/0165148 A1 | 7/2008 | Williamson |
| 2008/0177162 A1 | 7/2008 | Bae et al. |
| 2008/0181501 A1 | 7/2008 | Faraboschi |
| 2008/0181706 A1 | 7/2008 | Jackson |
| 2008/0192014 A1 | 8/2008 | Kent et al. |
| 2008/0204428 A1 | 8/2008 | Pierce et al. |
| 2008/0255794 A1 | 10/2008 | Levine |
| 2008/0315198 A1 | 12/2008 | Jung |
| 2009/0002328 A1 | 1/2009 | Ullrich et al. |
| 2009/0015560 A1 | 1/2009 | Robinson et al. |
| 2009/0096901 A1 | 4/2009 | Bae et al. |
| 2009/0101914 A1 | 4/2009 | Hirotsu et al. |
| 2009/0115734 A1 | 5/2009 | Fredriksson et al. |
| 2009/0120105 A1 | 5/2009 | Ramsay et al. |
| 2009/0128503 A1 | 5/2009 | Grant et al. |
| 2009/0135142 A1 | 5/2009 | Fu et al. |
| 2009/0146234 A1 | 6/2009 | Luo et al. |
| 2009/0167702 A1 | 7/2009 | Nurmi |
| 2009/0201400 A1 | 8/2009 | Zhang et al. |
| 2009/0218148 A1 | 9/2009 | Hugeback et al. |
| 2009/0219266 A1 | 9/2009 | Lim et al. |
| 2009/0225046 A1 | 9/2009 | Kim et al. |
| 2009/0236210 A1 | 9/2009 | Clark et al. |
| 2009/0267892 A1 | 10/2009 | Faubert |
| 2009/0291670 A1 | 11/2009 | Sennett et al. |
| 2010/0020036 A1 | 1/2010 | Hui et al. |
| 2010/0053087 A1 | 3/2010 | Dai et al. |
| 2010/0089735 A1 | 4/2010 | Takeda et al. |
| 2010/0110018 A1* | 5/2010 | Faubert .............. G06F 1/1626 345/173 |
| 2010/0134631 A1 | 6/2010 | Voth |
| 2010/0141408 A1 | 6/2010 | Doy et al. |
| 2010/0141606 A1 | 6/2010 | Bae et al. |
| 2010/0148944 A1 | 6/2010 | Kim et al. |
| 2010/0152620 A1 | 6/2010 | Ramsay et al. |
| 2010/0164894 A1 | 7/2010 | Kim et al. |
| 2010/0188422 A1 | 7/2010 | Shingai et al. |
| 2010/0231508 A1 | 9/2010 | Cruz-Hernandez et al. |
| 2010/0265197 A1 | 10/2010 | Purdy |
| 2010/0328229 A1 | 12/2010 | Weber et al. |
| 2011/0007023 A1 | 1/2011 | Abrahamsson et al. |
| 2011/0053577 A1 | 3/2011 | Lee et al. |
| 2011/0080500 A1 | 4/2011 | Wang et al. |
| 2011/0107958 A1 | 5/2011 | Pence et al. |
| 2011/0121765 A1 | 5/2011 | Anderson et al. |
| 2011/0128239 A1 | 6/2011 | Polyakov et al. |
| 2011/0148608 A1 | 6/2011 | Grant et al. |
| 2011/0156197 A1 | 6/2011 | Tivarus et al. |
| 2011/0156539 A1 | 6/2011 | Park et al. |
| 2011/0157052 A1 | 6/2011 | Lee et al. |
| 2011/0163985 A1 | 7/2011 | Bae et al. |
| 2011/0164162 A1 | 7/2011 | Kato |
| 2011/0193824 A1 | 8/2011 | Modarres et al. |
| 2011/0216013 A1 | 9/2011 | Siotis |
| 2011/0248948 A1 | 10/2011 | Griffin et al. |
| 2011/0260988 A1 | 10/2011 | Colgate et al. |
| 2011/0263200 A1 | 10/2011 | Thornton et al. |
| 2011/0291950 A1 | 12/2011 | Tong |
| 2011/0304559 A1 | 12/2011 | Pasquero |
| 2012/0092263 A1 | 4/2012 | Peterson et al. |
| 2012/0092541 A1 | 4/2012 | Tuulos et al. |
| 2012/0098964 A1 | 4/2012 | Oggier et al. |
| 2012/0126959 A1 | 5/2012 | Zarrabi et al. |
| 2012/0127088 A1 | 5/2012 | Pance et al. |
| 2012/0133494 A1 | 5/2012 | Cruz-Hernandez et al. |
| 2012/0139844 A1 | 6/2012 | Ramstein et al. |
| 2012/0162632 A1 | 6/2012 | Dutton |
| 2012/0206248 A1 | 8/2012 | Biggs |
| 2012/0256848 A1 | 10/2012 | Madabusi Srinivasan |
| 2012/0274578 A1 | 11/2012 | Snow et al. |
| 2012/0280927 A1 | 11/2012 | Ludwig |
| 2012/0319987 A1 | 12/2012 | Woo |
| 2012/0327006 A1 | 12/2012 | Israr et al. |
| 2013/0027345 A1 | 1/2013 | Binzel |
| 2013/0033967 A1 | 2/2013 | Chuang et al. |
| 2013/0043987 A1 | 2/2013 | Kasama et al. |
| 2013/0058816 A1 | 3/2013 | Kim |
| 2013/0106699 A1 | 5/2013 | Babatunde |
| 2013/0147981 A1 | 6/2013 | Wu |
| 2013/0191741 A1 | 7/2013 | Dickinson et al. |
| 2013/0207793 A1 | 8/2013 | Weaber et al. |
| 2013/0217491 A1 | 8/2013 | Hilbert et al. |
| 2013/0228023 A1 | 9/2013 | Drasnin et al. |
| 2013/0261811 A1 | 10/2013 | Yagi et al. |
| 2013/0300590 A1 | 11/2013 | Dietz et al. |
| 2014/0049683 A1 | 2/2014 | Guenter |
| 2014/0071321 A1 | 3/2014 | Seyama |
| 2014/0082490 A1 | 3/2014 | Jung et al. |
| 2014/0085065 A1 | 3/2014 | Biggs et al. |
| 2014/0132528 A1 | 5/2014 | Catton |
| 2014/0168153 A1 | 6/2014 | Deichmann et al. |
| 2014/0197936 A1 | 7/2014 | Biggs et al. |
| 2014/0231630 A1 | 8/2014 | Rae et al. |
| 2014/0232534 A1 | 8/2014 | Birnbaum et al. |
| 2014/0267076 A1 | 9/2014 | Birnbaum et al. |
| 2015/0005039 A1 | 1/2015 | Liu et al. |
| 2015/0040005 A1 | 2/2015 | Faaborg |
| 2015/0062391 A1 | 3/2015 | Murata |
| 2015/0098309 A1 | 4/2015 | Adams et al. |
| 2015/0169059 A1 | 6/2015 | Behles et al. |
| 2015/0194165 A1 | 7/2015 | Faaborg et al. |
| 2015/0205355 A1 | 7/2015 | Yairi |
| 2015/0205417 A1 | 7/2015 | Yairi et al. |
| 2015/0277559 A1 | 10/2015 | Vescovi et al. |
| 2015/0296480 A1 | 10/2015 | Kinsey et al. |
| 2015/0312479 A1 | 10/2015 | McMahon et al. |
| 2015/0350575 A1 | 12/2015 | Agranov et al. |
| 2016/0050379 A1 | 2/2016 | Jiang et al. |
| 2016/0099371 A1 | 4/2016 | Webster |
| 2016/0103544 A1 | 4/2016 | Filiz et al. |
| 2016/0205311 A1 | 7/2016 | Mandelli et al. |
| 2016/0218236 A1 | 7/2016 | Dhulla et al. |
| 2016/0219232 A1 | 7/2016 | Murata |
| 2016/0241119 A1 | 8/2016 | Keeler |
| 2016/0274237 A1 | 9/2016 | Stutz |
| 2016/0307325 A1 | 10/2016 | Wang et al. |
| 2016/0356890 A1 | 12/2016 | Fried et al. |
| 2016/0365380 A1 | 12/2016 | Wan |
| 2017/0038905 A1 | 2/2017 | Bijamov et al. |
| 2017/0047363 A1 | 2/2017 | Choi et al. |
| 2017/0052065 A1 | 2/2017 | Sharma et al. |
| 2017/0070131 A1 | 3/2017 | Degner et al. |
| 2017/0082746 A1 | 3/2017 | Kubota et al. |

(56) References Cited

U.S. PATENT DOCUMENTS

| | | |
|---|---|---|
| 2017/0084133 A1 | 3/2017 | Cardinali et al. |
| 2017/0142325 A1 | 5/2017 | Shimokawa et al. |
| 2017/0153703 A1 | 6/2017 | Yun et al. |
| 2017/0192508 A1 | 7/2017 | Lim et al. |
| 2017/0223292 A1 | 8/2017 | Ikeda |
| 2017/0242541 A1 | 8/2017 | Iuchi et al. |
| 2017/0255295 A1 | 9/2017 | Tanemura et al. |
| 2017/0272675 A1 | 9/2017 | Kobayashi |
| 2017/0311282 A1 | 10/2017 | Miller et al. |
| 2017/0345992 A1 | 11/2017 | Noguchi |
| 2017/0357325 A1 | 12/2017 | Yang et al. |
| 2017/0364158 A1 | 12/2017 | Wen et al. |
| 2017/0364736 A1 | 12/2017 | Ollila |
| 2017/0373106 A1 | 12/2017 | Li et al. |
| 2018/0059793 A1 | 3/2018 | Hajati |
| 2018/0060941 A1 | 3/2018 | Yang et al. |
| 2018/0081441 A1 | 3/2018 | Pedder et al. |
| 2018/0090526 A1 | 3/2018 | Mandai et al. |
| 2018/0090536 A1 | 3/2018 | Mandai et al. |
| 2018/0109742 A1 | 4/2018 | Agranov et al. |
| 2018/0174409 A1 | 6/2018 | Hill |
| 2018/0203513 A1 | 7/2018 | Rihn |
| 2018/0209846 A1 | 7/2018 | Mandai et al. |
| 2018/0213205 A1 | 7/2018 | Oh |
| 2018/0302881 A1 | 10/2018 | Miller et al. |
| 2019/0018119 A1 | 1/2019 | Laifenfeld et al. |
| 2019/0027674 A1 | 1/2019 | Zhang et al. |
| 2019/0159170 A1 | 5/2019 | Miller et al. |
| 2019/0214895 A1 | 7/2019 | Moussette et al. |
| 2019/0250713 A1 | 8/2019 | Chen |

FOREIGN PATENT DOCUMENTS

| | | |
|---|---|---|
| CA | 2355434 | 2/2002 |
| CN | 1324030 | 11/2001 |
| CN | 1630350 | 6/2005 |
| CN | 1692371 | 11/2005 |
| CN | 1774032 | 5/2006 |
| CN | 1817321 | 8/2006 |
| CN | 1833429 | 9/2006 |
| CN | 1842138 | 10/2006 |
| CN | 1947414 | 4/2007 |
| CN | 101120290 | 2/2008 |
| CN | 101189885 | 5/2008 |
| CN | 101221965 | 7/2008 |
| CN | 101233763 | 7/2008 |
| CN | 101409164 | 4/2009 |
| CN | 101472059 | 7/2009 |
| CN | 101567977 | 10/2009 |
| CN | 101622859 | 1/2010 |
| CN | 101739955 | 6/2010 |
| CN | 101754029 | 6/2010 |
| CN | 101763192 | 6/2010 |
| CN | 101803925 | 8/2010 |
| CN | 101903848 | 12/2010 |
| CN | 101938207 | 1/2011 |
| CN | 102025257 | 4/2011 |
| CN | 102036020 | 4/2011 |
| CN | 101057656 | 5/2011 |
| CN | 102067584 | 5/2011 |
| CN | 201829004 | 5/2011 |
| CN | 102163076 | 8/2011 |
| CN | 102208423 | 10/2011 |
| CN | 102246122 | 11/2011 |
| CN | 102315747 | 1/2012 |
| CN | 102451160 | 5/2012 |
| CN | 102591512 | 7/2012 |
| CN | 102667681 | 9/2012 |
| CN | 102668542 | 9/2012 |
| CN | 102713805 | 10/2012 |
| CN | 102754054 | 10/2012 |
| CN | 102768593 | 11/2012 |
| CN | 102820309 | 12/2012 |
| CN | 102821255 | 12/2012 |
| CN | 102844972 | 12/2012 |
| CN | 102915111 | 2/2013 |
| CN | 103019569 | 4/2013 |
| CN | 103024297 | 4/2013 |
| CN | 103051843 | 4/2013 |
| CN | 103154867 | 6/2013 |
| CN | 103155410 | 6/2013 |
| CN | 103181090 | 6/2013 |
| CN | 103218104 | 7/2013 |
| CN | 103278173 | 9/2013 |
| CN | 103329513 | 9/2013 |
| CN | 103416043 | 11/2013 |
| CN | 103440076 | 12/2013 |
| CN | 103546702 | 1/2014 |
| CN | 103567135 | 2/2014 |
| CN | 103970339 | 8/2014 |
| CN | 104049746 | 9/2014 |
| CN | 104220963 | 12/2014 |
| CN | 104956244 | 9/2015 |
| CN | 204761615 | 11/2015 |
| CN | 105556268 | 5/2016 |
| DE | 19517630 | 11/1996 |
| DE | 10330024 | 1/2005 |
| DE | 102009038103 | 2/2011 |
| DE | 102010060527 | 4/2012 |
| DE | 102011115762 | 4/2013 |
| EP | 0483955 | 5/1992 |
| EP | 1047258 | 10/2000 |
| EP | 1686776 | 8/2006 |
| EP | 1763228 | 3/2007 |
| EP | 2023611 | 2/2009 |
| EP | 2060967 | 5/2009 |
| EP | 2073099 | 6/2009 |
| EP | 2107610 | 10/2009 |
| EP | 2194444 | 6/2010 |
| EP | 2207080 | 7/2010 |
| EP | 2230690 | 9/2010 |
| EP | 2264562 A2 | 12/2010 |
| EP | 2315186 | 4/2011 |
| EP | 2374430 | 10/2011 |
| EP | 2395414 | 12/2011 |
| EP | 2461228 | 6/2012 |
| EP | 2512126 | 10/2012 |
| EP | 2631746 | 8/2013 |
| EP | 2434555 | 10/2013 |
| EP | 2787531 | 10/2014 |
| JP | S61123287 | 6/1986 |
| JP | 2007504670 | 8/1987 |
| JP | H05301342 A2 | 11/1993 |
| JP | 2000059697 | 2/2000 |
| JP | 2001211455 | 8/2001 |
| JP | 2001358994 | 12/2001 |
| JP | 2002199689 | 7/2002 |
| JP | 2002102799 | 9/2002 |
| JP | 200362525 | 3/2003 |
| JP | 2003527046 | 9/2003 |
| JP | 200494389 | 3/2004 |
| JP | 2004111590 | 4/2004 |
| JP | 2004236202 | 8/2004 |
| JP | 2005318504 | 11/2005 |
| JP | 2006150865 | 6/2006 |
| JP | 3831410 | 10/2006 |
| JP | 2006287361 | 10/2006 |
| JP | 2007516654 | 6/2007 |
| JP | 2007519099 | 7/2007 |
| JP | 200818928 | 1/2008 |
| JP | 2008507908 | 3/2008 |
| JP | 2008271280 | 11/2008 |
| JP | 2008543061 | 11/2008 |
| JP | 2009021809 | 1/2009 |
| JP | 2009159186 | 7/2009 |
| JP | 2009212909 | 9/2009 |
| JP | 2009296465 | 12/2009 |
| JP | 2010080604 | 4/2010 |
| JP | 2010114834 | 5/2010 |
| JP | 2010536040 | 11/2010 |
| JP | 2010272903 | 12/2010 |
| JP | 2011040926 | 2/2011 |
| JP | 201149697 | 3/2011 |
| JP | 2011091775 | 5/2011 |

(56) References Cited

FOREIGN PATENT DOCUMENTS

| | | |
|---|---|---|
| JP | 2011523840 | 8/2011 |
| JP | 11-216970 | 10/2011 |
| JP | 11-217315 | 10/2011 |
| JP | 2011097646 | 12/2011 |
| JP | 2012010306 | 1/2012 |
| JP | 2012019516 | 1/2012 |
| JP | 2012513160 | 6/2012 |
| JP | 2012135755 | 7/2012 |
| JP | 2013051523 | 3/2013 |
| JP | 2013070240 | 4/2013 |
| JP | 2013529035 | 7/2013 |
| JP | 2013149124 | 8/2013 |
| JP | 2014002729 | 1/2014 |
| JP | 2014509028 | 4/2014 |
| JP | 2014081254 | 5/2014 |
| JP | 2014235133 | 12/2014 |
| JP | 2014239323 | 12/2014 |
| JP | 2015153406 | 8/2015 |
| JP | 2015228214 | 12/2015 |
| JP | 2016095552 | 5/2016 |
| JP | 2016145776 | 8/2016 |
| KR | 20030034424 | 5/2003 |
| KR | 20030061157 | 7/2003 |
| KR | 20050033909 | 4/2005 |
| KR | 20050103732 | 11/2005 |
| KR | 2008/0069851 | 7/2008 |
| KR | 20100008239 | 1/2010 |
| KR | 1020100046602 | 5/2010 |
| KR | 20100065084 | 6/2010 |
| KR | 1020110101516 | 9/2011 |
| KR | 20130024420 | 3/2013 |
| KR | 20130074459 | 7/2013 |
| TW | 200520551 | 6/2005 |
| TW | 200518000 | 11/2007 |
| TW | 200803481 | 1/2008 |
| TW | 200951944 | 12/2009 |
| TW | 201110689 | 3/2011 |
| TW | 201145336 | 12/2011 |
| TW | 201218039 | 5/2012 |
| TW | 201301881 | 1/2013 |
| TW | 201425180 | 7/2014 |
| WO | WO 97/016932 | 5/1997 |
| WO | WO 00/051190 | 8/2000 |
| WO | WO 01/059558 | 8/2001 |
| WO | WO 01/089003 | 11/2001 |
| WO | WO 02/073587 | 9/2002 |
| WO | WO 03/038800 | 5/2003 |
| WO | WO 03/100550 | 12/2003 |
| WO | WO 05/041304 | 5/2005 |
| WO | WO 06/014641 | 2/2006 |
| WO | WO 06/057770 | 6/2006 |
| WO | WO 06/130443 | 12/2006 |
| WO | WO 07/049900 | 5/2007 |
| WO | WO 07/114631 | 10/2007 |
| WO | WO 08/075082 | 6/2008 |
| WO | WO 09/038862 | 3/2009 |
| WO | WO 09/068986 | 6/2009 |
| WO | WO 09/097866 | 8/2009 |
| WO | WO 09/122331 | 10/2009 |
| WO | WO 09/150287 | 12/2009 |
| WO | WO 10/085575 | 7/2010 |
| WO | WO 10/087925 | 8/2010 |
| WO | WO 10/120945 | 10/2010 |
| WO | WO 11/007263 | 1/2011 |
| WO | WO 12/011095 | 1/2012 |
| WO | WO 12/032353 | 3/2012 |
| WO | WO 12/052635 | 4/2012 |
| WO | WO 12/053363 | 4/2012 |
| WO | WO 12/088338 | 6/2012 |
| WO | WO 12/122572 | 9/2012 |
| WO | WO 12/129247 | 9/2012 |
| WO | WO 12/138687 | 10/2012 |
| WO | WO 13/008425 | 1/2013 |
| WO | WO 13/069148 | 5/2013 |
| WO | WO 13/150667 | 10/2013 |
| WO | WO 13/169299 | 11/2013 |
| WO | WO 13/169302 | 11/2013 |
| WO | WO 13/173838 | 11/2013 |
| WO | WO 13/179018 | 12/2013 |
| WO | WO 13/179020 | 12/2013 |
| WO | WO 13/186846 | 12/2013 |
| WO | WO 13/186847 | 12/2013 |
| WO | WO 14/018086 | 1/2014 |
| WO | WO 14/098077 | 6/2014 |
| WO | WO 15/023670 | 2/2015 |
| WO | WO 16/141482 | 9/2016 |
| WO | WO 17/112416 | 6/2017 |

OTHER PUBLICATIONS

Elgendi, "On the Analysis of Fingertip Photoplethysmogram Signals," *Current Cardiology Reviews*, 2012, vol. 8, pp. 14-25.

Feng, et al., "On the Stoney Formula for a Thin Film/Substrate System with Nonuniform Substrate Thickness," *Journal of Applied Mechanics*, Transactions of the ASME, vol. 74, Nov. 2007, pp. 1276-1281.

Fu, et al., "Heart Rate Extraction from Photoplethysmogram Waveform Using Wavelet Multui-resolution Analysis," *Journal of Medical and Biological Engineering*, 2008, vol. 28, No. 4, pp. 229-232.

Han, et al., "Artifacts in wearable photoplethysmographs during daily life motions and their reduction with least mean square based active noise cancellation method," *Computers in Biology and Medicine*, 2012, vol. 42, pp. 387-393.

Lopez-Silva, et al., "Heuristic Algorithm for Photoplethysmographic Heart Rate Tracking During Maximal Exercise Test," *Journal of Medical and Biological Engineering*, 2011, vol. 12, No. 3, pp. 181-188.

Santos, et al., "Accelerometer-assisted PPG Measurement During Physical Exercise Using the LAVIMO Sensor System," *Acta Polytechnica*, 2012, vol. 52, No. 5, pp. 80-85.

Sarkar, et al., "Fingertip Pulse Wave (PPG signal) Analysis and Heart Rate Detection," *International Journal of Emerging Technology and Advanced Engineering*, 2012, vol. 2, No. 9, pp. 404-407.

Schwarzer, et al., On the determination of film stress from substrate bending: Stoney's formula and its limits, Jan. 2006, 19 pages.

Yan, et al., "Reduction of motion artifact in pulse oximetry by smoothed pseudo Wigner-Ville distribution," *Journal of NeuroEngineering and Rehabilitation*, 2005, vol. 2, No. 3, pp. 1-9.

Yousefi, et al., "Adaptive Cancellation of Motion Artifact in Wearable Biosensors," 34th Annual International Conference of the IEEE EMBS, San Diego, California, Aug./Sep. 2012, pp. 2004-2008.

U.S. Appl. No. 15/132,094, filed Apr. 18, 2016, Fan.
U.S. Appl. No. 15/350,854, filed Nov. 14, 2016, Kleekajai et al.
U.S. Appl. No. 15/445,973, filed Feb. 28, 2017, Lin et al.
U.S. Appl. No. 15/590,775, filed May 9, 2017, Lee.
U.S. Appl. No. 15/627,409, filed Jun. 19, 2017, Agranov et al.

Charbon, et al., SPAD-Based Sensors, *TOF Range-Imaging Cameras*, F. Remondino and D. Stoppa (eds.), 2013, Springer-Verlag Berlin Heidelberg, pp. 11-38.

Cox, "Getting histograms with varying bin widths," http://www.stata.com/support/faqs/graphics/histograms-with-varying-bin-widths/, Nov. 13, 2017, 5 pages.

Gallivanoni, et al., "Progress n Quenching Circuits for Single Photon Avalanche Diodes," IEEE Transactions on Nuclear Science, vol. 57, No. 6, Dec. 2010, pp. 3815-3826.

Leslar, et al., "Comprehensive Utilization of Temporal and Spatial Domain Outlier Detection Methods for Mobile Terrestrial LiDAR Data," Remote Sensing, 2011, vol. 3, pp. 1724-1742.

Mota, et al., "A flexible multi-channel high-resolution Time-to-Digital Converter ASIC," *Nuclear Science Symposium Conference Record IEEE*, 2000, Engineering School of Geneva, Microelectronics Lab, Geneva, Switzerland, 8 pages.

Niclass, et al., "Design and Characterization of a CMOS 3-D Image Sensor Based on Single Photon Avalanche Diodes," *IEEE Journal of Solid-State Circuits*, vol. 40, No. 9, Sep. 2005, pp. 1847-1854.

Shin, et al., "Photon-Efficient Computational 3D and Reflectivity Imaging with Single-Photon Detectors," IEEE International Conference on Image Processing, Paris, France, Oct. 2014, 11 pages.

(56) References Cited

OTHER PUBLICATIONS

Tisa, et al., "Variable-Load Quenching Circuit for single-photon avalanche diodes," Optics Express, vol. 16, No. 3, Feb. 4, 2008, pp. 2232-2244.

Ullrich, et al., "Linear LIDAR versus Geiger-mode LIDAR: Impact on data properties and data quality," *Laser Radar Technology and Applications XXI*, edited by Monte D. Turner, Gary W. Kamerman, Proc. of SPIE, vol. 9832, 983204, 2016, 17 pages.

Jahromi et al., "A Single Chip Laser Radar Receiver with a 9x9 SPAD Detector Array and a 10-channel TDC," 2013 Proceedings of the ESSCIRC, IEEE, Sep. 14, 2015, pp. 364-367.

Shen et al., "Stresses, Curvatures, and Shape Changes Arising from Patterned Lines on Silicon Wafers," Journal of Applied Physics, vol. 80, No. 3, Aug. 1996, pp. 1388-1398.

Actuator definition downloaded from http://www.thefreedictionary.com/actuator on May 3, 2018, 2 pages.

Astronomer's Toolbox, "The Electromagnetic Spectrum," http://imagine.gsfc.nasa.gov/science/toolbox/emspectrum1.html, updated Mar. 2013, 4 pages.

Hasser et al., "Preliminary Evaluation of a Shape-Memory Alloy Tactile Feedback Display," Advances in Robotics, Mechantronics, and Haptic Interfaces, ASME, DSC—vol. 49, pp. 73-80, 1993.

Hill et al., "Real-time Estimation of Human Impedance for Haptic Interfaces," Stanford Telerobotics Laboratory, Department of Mechanical Engineering, Stanford University, Third Joint Eurohaptics Conference and Symposium on Haptic Interfaces for Virtual Environment and Teleoperator Systems, Salt Lake City, Utah, Mar. 18-20, 2009, pp. 440-445.

Kim et al., "Tactile Rendering of 3D Features on Touch Surfaces," UIST '13, Oct. 8-11, 2013, St. Andrews, United Kingdom, 8 pages.

Lee et al, "Haptic Pen: Tactile Feedback Stylus for Touch Screens," Mitsubishi Electric Research Laboratories, http://wwwlmerl.com, 6 pages, Oct. 2004.

Nakamura, "A Torso Haptic Display Based on Shape Memory Alloy Actuators," Massachusetts Institute of Technology, 2003, pp. 1-123.

PuntoCellulare, "LG-GD910 3G Watch Phone," YouTube (http://www.youtube.com/watch?v+HcCl87KIELM), Jan. 8, 2009, 9 pages.

Sullivan, Mark, "This Android Wear Update Turns Your Device into The Dick Tracy Watch," Fast Company (https://www.fastcompany.com/3056319/this-android-wear-update-turns-your-device-into-the-dick-tracy-watch), Feb. 4, 2016, 9 pages.

\* cited by examiner

TECHNIQUES FOR PROVIDING A HAPTIC OUTPUT AND SENSING A HAPTIC INPUT USING A PIEZOELECTRIC BODY

FIELD

The present disclosure generally relates to haptic interfaces, and to techniques for providing a haptic output and sensing a haptic input using a piezoelectric body. The haptic output may be provided by actuating the piezoelectric body.

BACKGROUND

Electronic devices are commonplace in today's society. Some electronic devices incorporate a haptic interface (e.g., a haptic input or output system). An electronic device with a haptic interface may activate the haptic interface to solicit a user's attention, enhance the user's interaction experience with the electronic device, displace the electronic device or a component of the electronic device, or provide any other suitable notification or user experience. An electronic device with a haptic interface may also, or alternatively, receive a force input from a user via the haptic interface, and in response to the force input, wake up a portion of the electronic device, manipulate a graphical element on a display of the electronic device, or perform another operation in response to the force input.

Piezoelectric materials can convert between mechanical energy and electrical energy. A piezoelectric material (or piezoelectric body) may be used to convert mechanical energy into electrical energy using what has been referred to as the direct piezoelectric effect. Conversion of mechanical energy into electrical energy can be used to sense a mechanical force or pressure on, or displacement of, a piezoelectric body. A piezoelectric body may also, or alternatively, convert electrical energy into mechanical energy using what has been referred to as the inverse piezoelectric effect. Conversion of electrical energy into mechanical energy can be used to actuate a piezoelectric body and, in some cases, move or displace the piezoelectric body.

One application for piezoelectric bodies is in haptic interfaces of electronic devices. The direct piezoelectric effect can be used to sense a haptic input to the haptic interface (e.g., a user's force or pressure on, or displacement of, a piezoelectric body included in a haptic interface). The inverse piezoelectric effect can be used to provide a haptic output via the haptic interface (e.g., a piezoelectric body may be electrically charged to cause the piezoelectric body to produce a force, pressure, or displacement that can be perceived by a user of the haptic interface).

SUMMARY

The present disclosure is directed to haptic interfaces, and to techniques for providing a haptic output and sensing a haptic input using a piezoelectric body. In particular, the present disclosure describes a control circuit for a piezoelectric body of a haptic interface. The control circuit may be used to both actuate the piezoelectric body, to provide a haptic output, and to sense an electrical change corresponding to a haptic input received by the piezoelectric body. In some embodiments, a piezoelectric body may be simultaneously actuated and sensed. In some embodiments, the control circuit may include an overcurrent protection circuit that limits current flow into a sensing portion of the control circuit while an actuation portion of the control circuit is charging the piezoelectric body. The overcurrent protection circuit may be needed because a haptic actuation signal provided by the actuation portion of the control circuit may be sensed by the sensing portion of the control circuit, and may be one or more orders of magnitude greater than a haptic input signal intended to be sensed by the sensing portion of the control circuit. The haptic actuation signal could therefore damage the sensing portion of the control circuit in the absence of an overcurrent protection circuit.

In a first aspect of the present disclosure, a haptic interface is described. The haptic interface may include a piezoelectric body and first and second electrodes coupled to the piezoelectric body. The haptic interface may also include a control circuit. The control circuit may include a haptic actuator circuit, a haptic sensor circuit, and an overcurrent protection circuit. The haptic actuator circuit may be coupled to the first electrode and configured to charge the piezoelectric body. The charging may cause the piezoelectric body to provide a haptic output. The haptic sensor circuit may be coupled to the second electrode and configured to sense an electrical change at the second electrode. The electrical change may be related to a haptic input received by the piezoelectric body. The overcurrent protection circuit may be coupled to the second electrode and configured to limit a current flow into the haptic sensor circuit while the haptic actuator circuit is charging the piezoelectric body.

In another aspect of the present disclosure, another haptic interface is described. The haptic interface may include a piezoelectric body and first and second electrodes coupled to the piezoelectric body. The haptic interface may also include a control circuit. The control circuit may include a haptic actuator circuit, a haptic sensor circuit, and an overcurrent protection circuit. The haptic actuator circuit may be coupled to the first electrode and configured to maintain a charge on the piezoelectric body. The charge may cause the piezoelectric body to provide a haptic output. The haptic sensor circuit may be coupled to the second electrode and configured to sense an electrical change at the second electrode while the piezoelectric body is charged. The electrical change may be related to a haptic input received by the piezoelectric body.

In yet another aspect of the present disclosure, a method of operating a haptic interface is described. The method may include charging a piezoelectric body of the haptic interface to deliver a haptic output, limiting a current flow into a haptic sensor circuit while charging the piezoelectric body, and monitoring for a haptic input to the piezoelectric body using the haptic sensor circuit while the piezoelectric body is charged.

In addition to the exemplary aspects and embodiments described above, further aspects and embodiments will become apparent by reference to the drawings and by study of the following description.

BRIEF DESCRIPTION OF THE DRAWINGS

The present disclosure will be readily understood by the following detailed description in conjunction with the accompanying drawings, wherein like reference numerals designate like structural elements, and in which.

DETAILED DESCRIPTION

Figure 1:
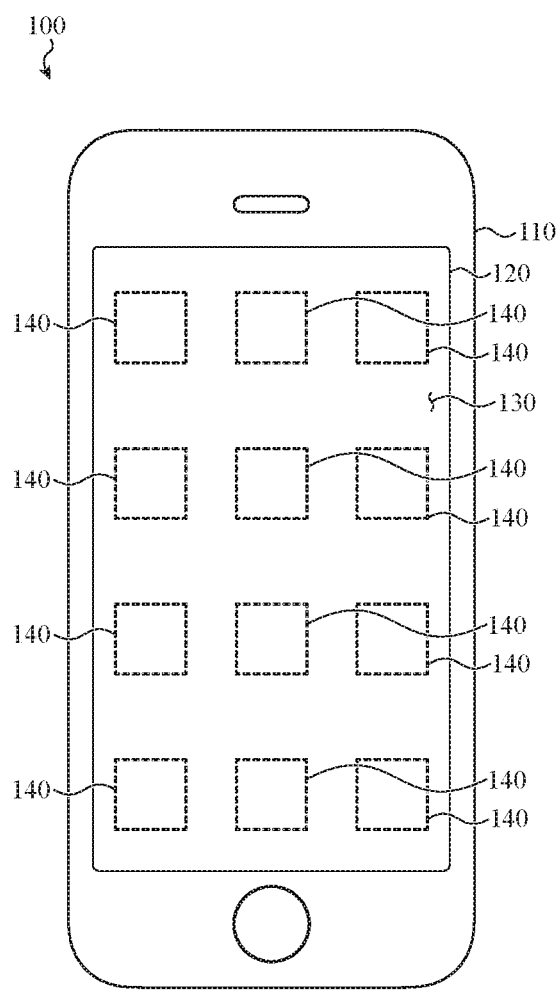
FIG. 1 shows a front view of an electronic device incorporating a sample haptic interface.

Reference will now be made in detail to representative embodiments illustrated in the accompanying drawings. It should be understood that the following description is not intended to limit the description to a preferred embodiment. To the contrary, it is intended to cover alternatives, modifications, and equivalents to the described embodiments, as can be included within the spirit and scope of the described embodiments as defined by the appended claims.

The embodiments described herein are directed to a haptic interface that receives and provides localized haptic inputs and output for an electronic device. The haptic interface may include a set of piezoelectric bodies (e.g., synthetic ceramic bodies (e.g., lead zirconate titanate (PZT) bodies), lead-free piezoceramic bodies (e.g., sodium potassium niobate bodies), natural crystal bodies (e.g., quartz bodies, synthetic crystal bodies, and so on), and may provide or be coupled to a surface such as, for example, a cover glass or display of the electronic device. When a piezoelectric body of the haptic interface is compressed, deflected, deformed, or otherwise moved by a haptic input (e.g., by a user or structure, such as a user intending to press a key of a keyboard or a button), the compression, deflection, deformation, or other movement may be measured, and a signal corresponding to the compression, deflection, deformation, or other movement may be received by a processor of the electronic device. In some cases, the processor may wake up a portion of the electronic device, manipulate a graphical element on a display of the electronic device, clear a notification, stop a timer, or perform another operation in response to the signal. The processor may also activate the haptic interface (e.g., by generating an electric field that causes one or more piezoelectric bodies to compress, deflect, deform, rapidly change shape (e.g., vibrate), or otherwise physically change) to solicit a user's attention, enhance the user's interaction experience with the electronic device, displace the electronic device or a component of the electronic device, or provide any other suitable notification or user experience.

In some examples, a compression, deflection, deformation, or other movement of a piezoelectric body may cause a change in voltage between electrodes attached to the piezoelectric body. Conversely, a processor may apply an electric current or voltage to the electrodes to cause the piezoelectric body to compress, deflect, deform, vibrate, or otherwise move.

In some implementations, the size, change, state, or rate of change in a piezoelectric body may be related to the amount of compression, deflection, deformation, or movement of the haptic interface and, as a result, the magnitude or strength of haptic input or output. Thus, the greater the change in compression, deflection, deformation, or other movement of a piezoelectric body, the greater the haptic input (e.g., force input) or haptic output (e.g., force output).

A panel-sized vibration actuator (e.g., for display panel haptic applications) can be constructed with multiple piezoelectric bodies assembled on a flex circuit or sandwiched between flex circuits. In such an architecture, two electrodes may be positioned on opposite faces of each piezoelectric body. For example, a top electrode can be formed on a top face of a piezoelectric body and a bottom electrode can be formed on a bottom face of the piezoelectric body. In some cases, the bottom electrode can wrap around a sidewall of the piezoelectric body. In such a configuration, the top electrode and the bottom electrode may both occupy a portion of the top face of the piezoelectric body.

A set of piezoelectric bodies, each with corresponding electrodes, may be sandwiched between first and second substrates, such as first and second flex circuits, or a flex circuit and a stiffener. Each piezoelectric body may be electrically connected to the first or second substrate. For example, a first electrical connection can be made between a top electrode of a piezoelectric body and an electrical conductor on or within a top flex circuit, and a second electrical connection can be made between a bottom electrode of the piezoelectric body and an electrical conductor on or within a bottom flex circuit.

The first and second electrical connections can be established using any number of suitable techniques including, but not limited to, soldering, welding, bonding with a conductive adhesive, bonding with a conductive tape, placing conductive surfaces in contact, and so on.

In some use cases, it may be useful to sense a haptic input while providing a haptic output. In some cases, a haptic input and haptic output may be sensed/provided by different piezoelectric bodies and respective control circuits, because haptic actuation signals may be orders of magnitude greater than haptic input signals (e.g., milliamps versus nano-Coulombs), making piezoelectric actuation and sensing circuits incompatible. In other cases, and as described in the present disclosure, piezoelectric actuation and sensing circuits may be used in conjunction with a single piezoelectric body (or single set of piezoelectric bodies) by using an overcurrent protection circuit to protect the sensing circuit during time periods when the charging of a piezoelectric body may damage the sensing circuit. When piezoelectric actuation and sensing circuits are combined, haptic input to a piezoelectric body may be sensed while the piezoelectric body is charged (and also while the piezoelectric is not charged).

Techniques are described for providing a haptic output and sensing a haptic input using a piezoelectric body. In some embodiments, the techniques limit a current flow into a haptic sensor circuit while charging a piezoelectric body to deliver a haptic output, and enable monitoring for a haptic input to the piezoelectric body while the piezoelectric body is charged. This and other embodiments are discussed in more detail below, with reference to FIGS. 1-18. However, those skilled in the art will readily appreciate that the detailed description given herein with respect to these figures is for explanation only and should not be construed as limiting.

FIG. 1 shows a front view of an electronic device 100 incorporating a sample haptic interface, such as one of the haptic interfaces described herein. The electronic device 100 is illustrated as a smartphone, although this is not required and other electronic devices can incorporate the haptic interfaces described herein. These include, but are not limited to, wearable devices, tablet computers, cellular devices, peripheral input devices, game controllers, vehicle control circuits, laptop computers, industrial control circuits, consumer appliances, industrial machinery, and so on.

In the illustrated embodiment, the electronic device 100 includes a housing 110 to retain, support, and/or enclose various components of the electronic device 100, such as a display 120. The housing 110 may be a unitary housing, a housing that includes a front piece secured to a back piece, or a housing that includes any number or arrangement of pieces. The display 120 can include a stack of multiple layers including, for example, and in no particular order: a light-emitting display layer (e.g., an organic light emitting diode (OLED) layer), a cover layer, a touch input layer, a haptic interface layer, a biometric layer, and so on. Other embodiments can implement the display 120 in a different manner, such as with liquid crystal display (LCD) technology, electronic ink technology, quantum dot technology, organic electro luminescence (OEL) technology, or other light-emitting display technologies. The light-emitting display layer may be viewable through one or more of the other layers. Other embodiments can also include different numbers of layers. In some embodiments, a protective outer layer of the display 120 may define an input surface 130.

Regardless of the implementation-specific display technology or technologies selected for a particular embodiment, the various layers of the display 120 may be adhered together with an optically transparent adhesive and/or may be supported by a common frame such that the layers abut one another.

The common frame can be made from any suitable material such as, but not limited to: metal, plastic, ceramic, acrylic, and so on. The common frame may be a multi-purpose component serving an additional function such as, but not limited to: providing an environmental and/or hermetic seal to one or more components of the display 120 or the electronic device 100; providing structural support to the housing 110; providing pressure relief to one or more components of the display 120 or the electronic device 100; providing and defining gaps between one or more layers of the display 120 for thermal venting and/or to permit flexing of the layers in response to a force (input or output) applied to the input surface 130; and so on.

In some embodiments, the layers of the display 120 may be attached or deposited onto separate substrates that may be laminated or bonded to each other. The display 120 may also include or be positioned adjacent to other layers suitable for improving the structural or optical performance of the display 120, including, but not limited to, a cover glass sheet, polarizer sheets, color masks, and the like. Additionally, the display 120 may include a touch sensor (not shown) for determining the location of one or more touches on the input surface 130 of the electronic device 100. In some embodiments, the touch sensor may be a capacitive touch sensor configured to detect the location and/or area of one or more touches of a user's finger and/or a passive or active stylus on the input surface 130. The electronic device 100 may also include a haptic structure (e.g., a piezoelectric body) for both 1) providing a haptic output to a user of the electronic device 100 and 2) receiving a haptic input from the user.

The electronic device 100 can also include a processor, memory, power supply and/or battery, network connections, sensors, input/output mechanisms (e.g., devices or ports), acoustic elements, haptic elements, digital and/or analog circuits for performing and/or coordinating tasks of the electronic device 100, and so on. For simplicity of illustration, the electronic device 100 is depicted in FIG. 1 without many of these elements, each of which may be included, partially and/or entirely, within the housing 110 and may be operationally or functionally associated with, or coupled to, the display 120.

One or more haptic structures (e.g., piezoelectric bodies 140) of a haptic interface can be disposed below the input surface 130. The haptic structures may be arranged in an array or other pattern and positioned behind or within the display 120, although haptic structures may also or alternatively be positioned behind or within non-display portions of the electronic device 100, such as in sidewalls, rear walls, non-display portions of a front of the electronic device 100, on a back side of the electronic device 100, and so on. As a result of this arrangement, each haptic structure can provide localized haptic output, or receive local haptic input, to/from a user touching the display 120. The haptic structures may be of any suitable size or shape.

FIGS. 2A, 2B, 3A, 3B, 4A, and 4B show various anchoring configurations for piezoelectric bodies that may be used in conjunction with a haptic interface such as the haptic interface described with reference to FIG. 1. The anchoring configurations shown are examples only, and are not intended to limit the types of anchoring configurations that may be used for a piezoelectric body in a haptic interface.

Figure 2A:
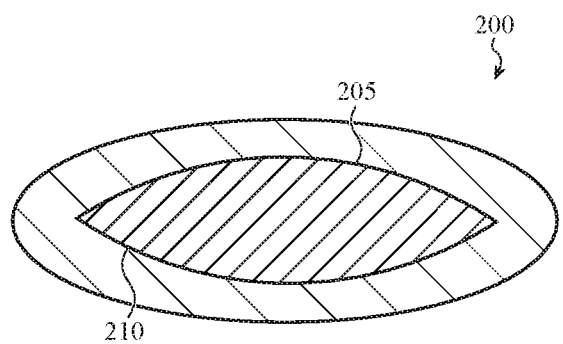
FIGS. 2A and 2B show a first anchoring configuration that may be used for a piezoelectric body of a haptic interface.
Figure 2B:
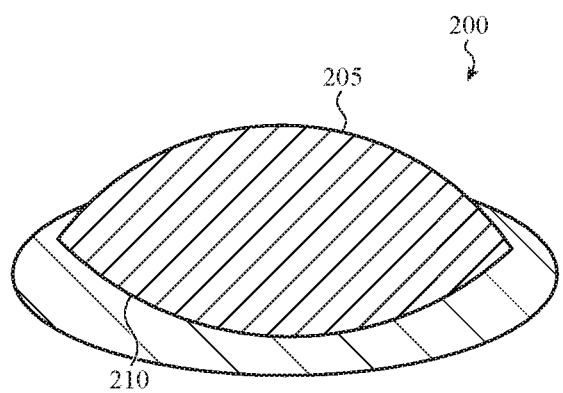

FIGS. 2A and 2B show a first anchoring configuration 200 for a piezoelectric body 205. FIG. 2A shows the piezoelectric body 205 in a non-energized state, and FIG. 2B shows the piezoelectric body 205 in an energized state.

In accordance with the first anchoring configuration 200, the piezoelectric body 205 may be clamped around its perimeter 210, and when actuated (energized) may form a dome (FIG. 2B). When not actuated (non-energized), and by way of example, the piezoelectric body 205 may take the form of a round disc (see, FIG. 2A; or a dome of lower height). The piezoelectric body 205 shown in FIGS. 2A and 2B may be referred to as a piezo dome.

Figure 3A:
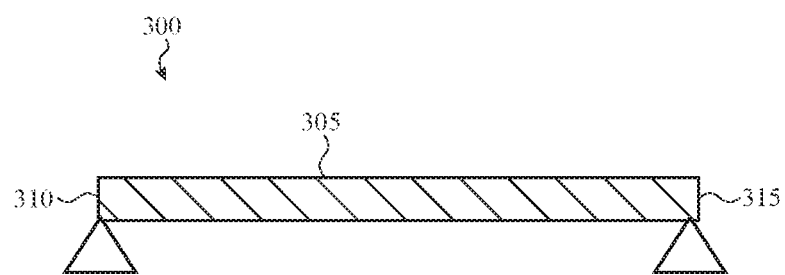
FIGS. 3A and 3B show a second anchoring configuration that may be used for a piezoelectric body of a haptic interface.
Figure 3B:
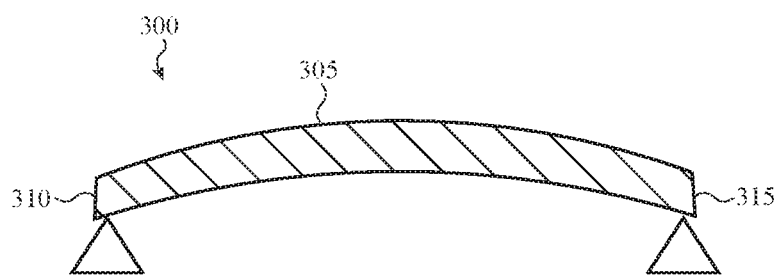

FIGS. 3A and 3B show a second anchoring configuration 300 for a piezoelectric body 305. FIG. 3A shows the piezoelectric body 305 in a non-energized state, and FIG. 3B shows the piezoelectric body 305 in an energized state.

In accordance with the second anchoring configuration 300, the piezoelectric body 305 may be clamped at two ends (e.g., two opposite ends 310, 315), and when actuated (energized) may bend up in the middle (as shown) or down (not shown). When not actuated (non-energized), and by way of example, the piezoelectric body 305 may take the form of a flat bar or sheet of material. The piezoelectric body 305 shown in FIGS. 3A and 3B may be referred to as a piezo bender, clamped on both ends.

Figure 4A:
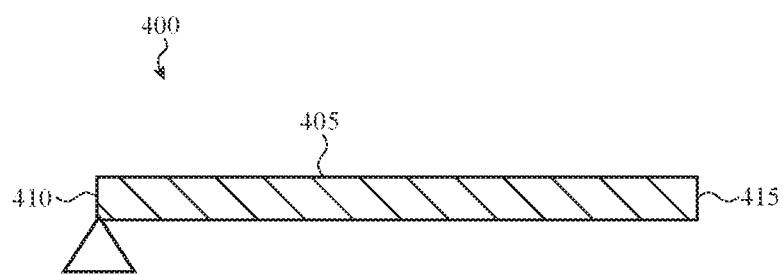
FIGS. 4A and 4B show a third anchoring configuration that may be used for a piezoelectric body of a haptic interface.
Figure 4B:
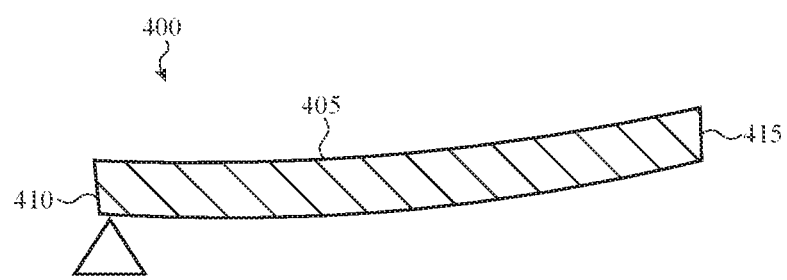

FIGS. 4A and 4B show a third anchoring configuration 400 for a piezoelectric body 405. FIG. 4A shows the piezoelectric body 405 in a non-energized state, and FIG. 4B shows the piezoelectric body 405 in an energized state.

In accordance with the third anchoring configuration 400, the piezoelectric body 405 may be clamped at one end 410, and when actuated (energized) may bend up or down at another end 415 (e.g., an opposite end). When not actuated (non-energized), and by way of example, the piezoelectric body 405 may take the form of a flat bar or sheet of material. The piezoelectric body 405 shown in FIGS. 4A and 4B may be referred to as a piezo bender, clamped on one end.

Figure 5A:
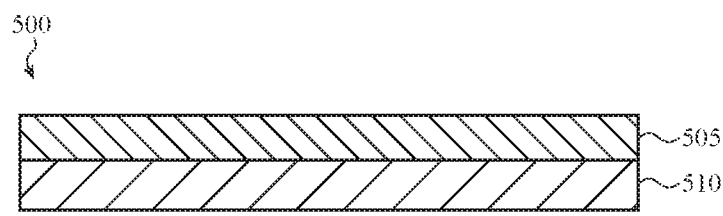
FIGS. 5A, 5B, and 5C show sample constructions of a piezoelectric body that may be used in a haptic interface.
Figure 5B:
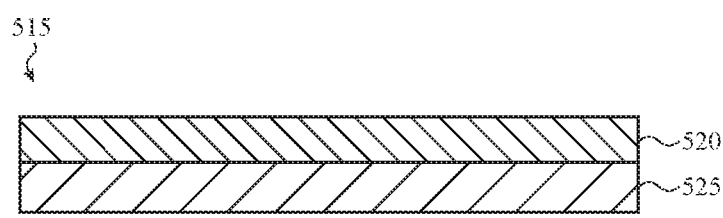
Figure 5C:
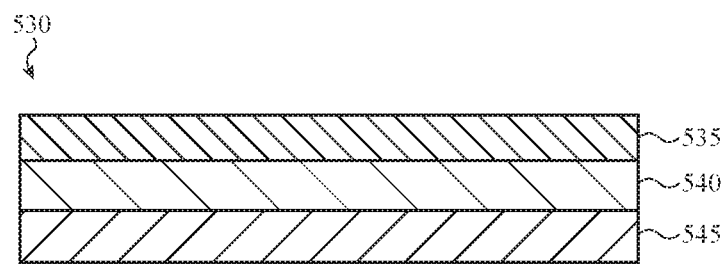

FIGS. 5A, 5B, and 5C show sample constructions of a piezoelectric body. The sample constructions may be employed in the haptic interface described with reference to FIG. 1, with any of the anchoring configurations described with reference to FIG. 2A, 2B, 3A, 3B, 4A, or 4B, or with other types of haptic interfaces or piezoelectric anchoring configurations.

FIG. 5A shows a unimorph construction of a piezoelectric body 500, in which a first layer 505 of piezoelectric material may be attached to a second layer 510 of non-piezoelectric material (e.g., a non-piezoelectric elastic material, such as a flex circuit). FIG. 5B shows a bimorph construction of a piezoelectric body 515, in which a first layer 520 of piezoelectric material may be attached to a second layer 525 of piezoelectric material. FIG. 5C shows a trimorph construction of a piezoelectric body 530, in which a first layer 535 of piezoelectric material is attached to one side of a layer 540 of non-piezoelectric material (e.g., a non-piezoelectric elastic material, such as a flex circuit), and a second layer 545 of piezoelectric material is attached to an opposite side of the layer 540 of non-piezoelectric material.

Figure 6:
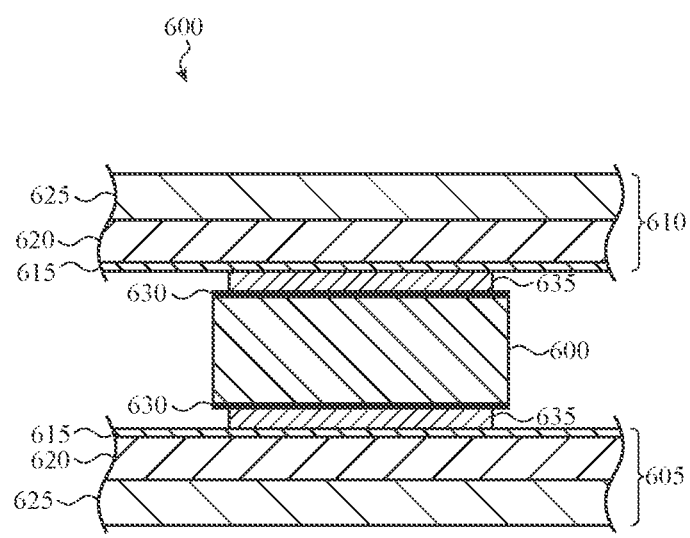
FIG. 6 shows a cross-section of a piezoelectric body attached to first and second electrodes.

FIG. 6 shows a cross-section of a piezoelectric body 600 attached to first and second substrates 605, 610 (e.g., a bottom substrate 605 and a top substrate 610). As shown in FIG. 6, each of the first substrate 605 and the second substrate 610 may include multiple layers, such as a nickel (Ni) alloy layer 615, a copper (Cu) layer 620, and a platinum (Pl) layer 625. The copper layers 620 may include electrical conductors for routing signals between the piezoelectric body 600 and a circuit (e.g., a processor). The platinum layers 625 may act as stiffeners or ground shields for each substrate 605, 610. The nickel alloy layers 615 may provide conductive pads to which electrodes 630 attached to the piezoelectric body 600 may be bonded using a conductive adhesive 635 (e.g., an isotropic conductive film (ICF) or other conductive adhesive).

Figure 7:
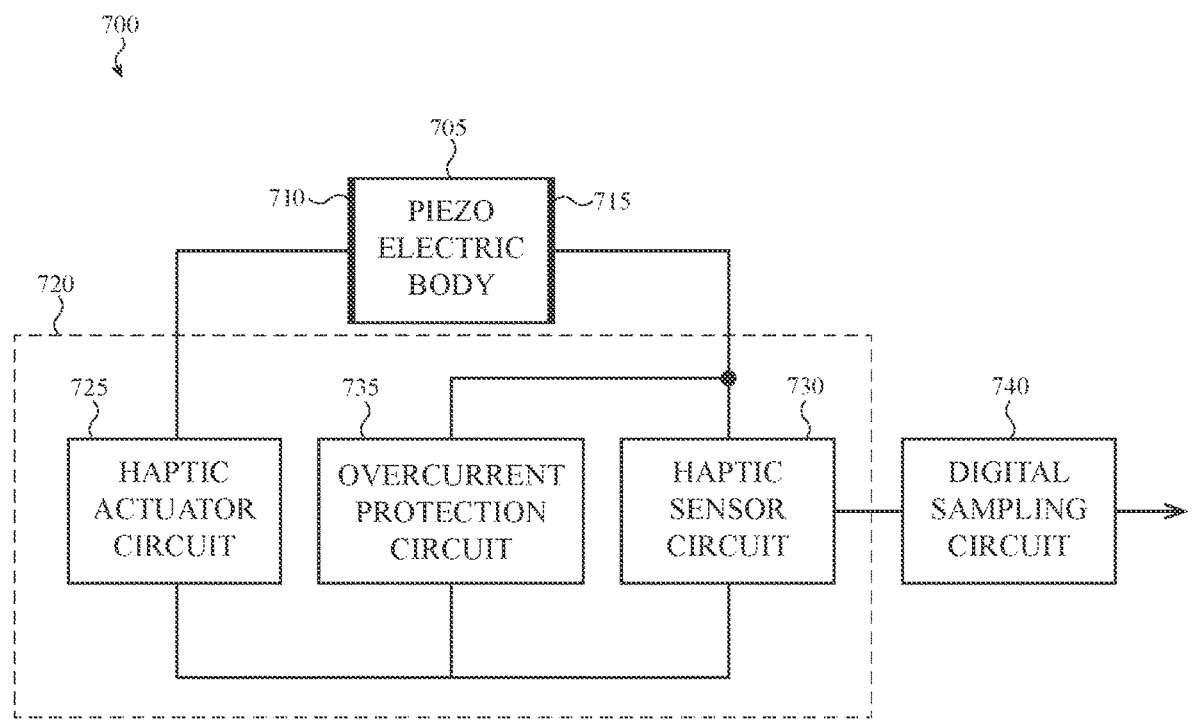
FIG. 7 shows a block diagram of a haptic interface capable of providing a haptic output and sensing a haptic input.

Referring to FIG. 7, there is shown a block diagram of a haptic interface 700 capable of providing a haptic output and sensing a haptic input. The haptic interface 700 may be an example of the haptic interface described with reference to FIG. 1.

The haptic interface 700 may include a piezoelectric body 705, first and second electrodes 710, 715 that are coupled to the piezoelectric body 705 to form a capacitor ($C_P$), and a control circuit 720. The piezoelectric body 705 may take any of the forms described with reference to FIGS. 2-5, or other forms. In some embodiments, the piezoelectric body 705 may be configured as shown in FIG. 2A, 2B, 3A, 3B, 4A, 4B, 5A, 5B, 5C, or 6. The control circuit 720 may include a haptic actuator circuit 725 and a haptic sensor circuit 730. The haptic actuator circuit 725 may be coupled to the first electrode 710, and may be configured to charge the piezoelectric body 705 to provide a haptic output. The haptic sensor circuit 730 may be coupled to the second electrode 715, and may be configured to sense an electrical change at the second electrode 715. The electrical change may be a change in voltage, current, or charge, for example, and may be related to a haptic input (e.g., a force input) received by the piezoelectric body 705.

Optionally, the control circuit 720 may also include an overcurrent protection circuit 735. The overcurrent protection circuit 735 may be switchably operated (e.g., in response to a control signal) or automatically enabled (e.g., in response to an electrical change in the haptic interface 700) to limit a current flow into the haptic sensor circuit 730 while the haptic actuator circuit 725 is charging the piezoelectric body 705. The overcurrent protection circuit 735 may be needed to protect the haptic sensor circuit 730 because of one or more orders of magnitude difference between a haptic actuation signal provided by the haptic actuator circuit 725 to the piezoelectric body 705, to actuate the piezoelectric body 705, and a haptic input signal intended to be sensed by the haptic sensor circuit 730 (e.g., the haptic actuation signal may be one or more orders of magnitude greater than the haptic input signal).

A digital sampling circuit 740, such as an analog-to-digital converter (ADC), may be coupled to an output of the haptic sensor circuit 730.

Figure 8:
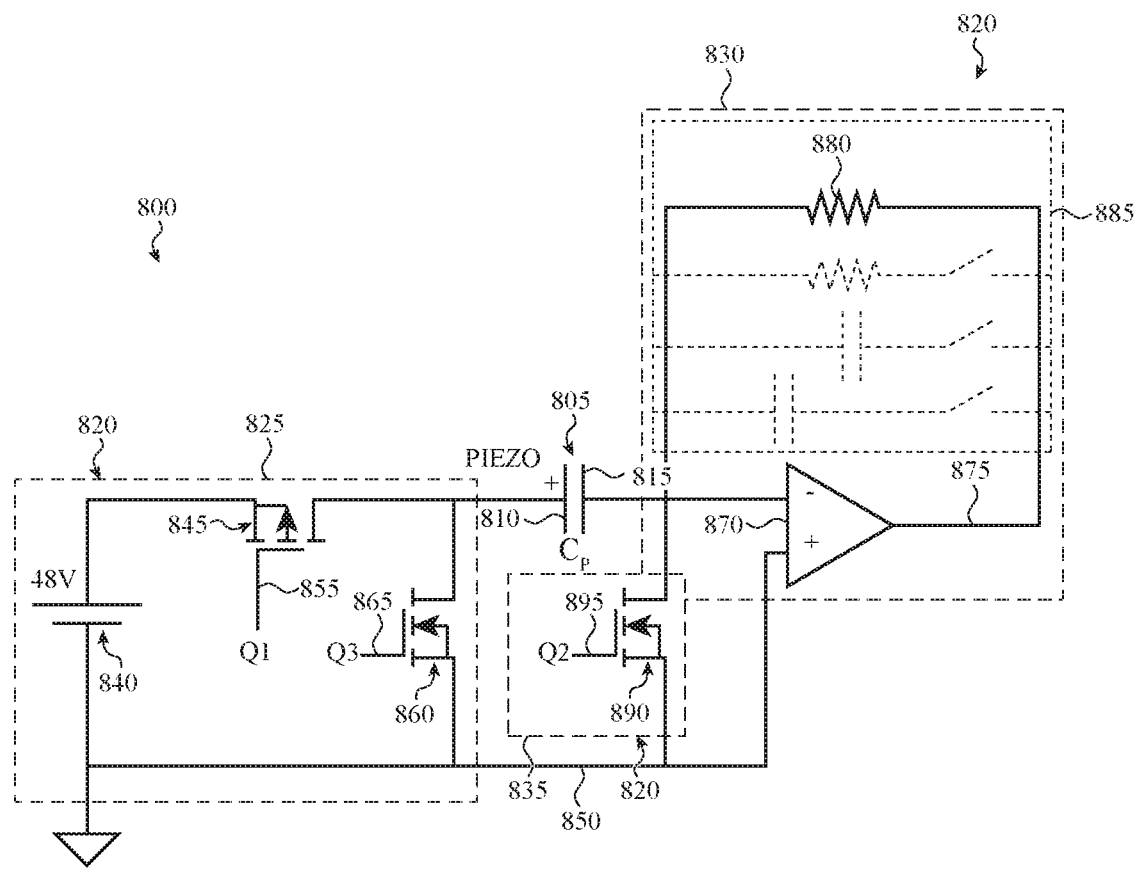
FIG. 8 shows a sample first circuit schematic for a haptic interface.

FIG. 8 shows a sample first circuit schematic 800 for a haptic interface, such as the haptic interface of FIG. 7. The haptic interface may include a piezoelectric body 805, a first electrode 810 coupled to the piezoelectric body 805, and a second electrode 815 coupled to the piezoelectric body 805. By way of example, the piezoelectric body 805 is depicted as a capacitor $C_P$ having a variable capacitance. In some cases, the piezoelectric body 805 may represent multiple piezoelectric bodies. The haptic interface may also include a control circuit 820. The control circuit 820 may include a haptic actuator circuit 825, a haptic sensor circuit 830, and an overcurrent protection circuit 835.

The haptic actuator circuit 825 may be coupled to the first electrode 810 and may be configured to charge the piezoelectric body 805. The charging may cause the piezoelectric body 805 to provide a haptic output (e.g., compress, deflect, deform, or otherwise physically change shape). The haptic sensor circuit 830 may be coupled to the second electrode 815 and may be configured to sense an electrical change (e.g., a change in voltage, change in current, or change in charge) at the second electrode 815. The electrical change may be related to a haptic input received by the piezoelectric body 805. The overcurrent protection circuit 835 may be coupled to the second electrode 815 and may be configured to limit a current flow into the haptic sensor circuit 830 while the haptic actuator circuit 825 is charging the piezoelectric body 805.

The haptic actuator circuit 825 may include a power source 840 and a first transistor 845, coupled in series between the first electrode 810 and a discharge node 850 (e.g., a ground). By way of example, the power source 840 is shown to be a 48V power source. In other embodiments, the power source 840 could supply a higher or lower voltage. The first transistor 845 may be coupled between the power source 840 and the first electrode 810 via its source and drain terminals, and may have a control input 855 (e.g., a gate input) configured to receive a signal that causes the first transistor 845 to open or close a current path between the first electrode 810 and the power source 840. The haptic actuator circuit 825 may also include a second transistor 860 coupled between the first electrode 810 and the discharge node 850. The second transistor 860 may be coupled between the first electrode 815 and the discharge node 850 via its source and drain terminals, and may have a control input 865 (e.g., a gate input) configured to receive a signal that causes the second transistor 860 to open or close a current path between the first electrode 810 and the discharge node 850.

The haptic sensor circuit 830 may include a sense amp 870 having a negative input coupled to the second electrode 815, a positive input coupled to the discharge node 850, and an output 875. A resistor 880 may be coupled between the negative input and the output 875. The configuration of the sense amp 870 is that of a transimpedance amplifier, which has no memory and can sense haptic input faster than certain other amplifier configurations. In some embodiments, the resistor 880 may be part of (or replaced by) a set of impedances 885. In some embodiments, the set of impedances 885 may include a number of resistors and capacitors connected in parallel. In some embodiments, one or more (or each) of the parallel-connected impedances may be connected in series with a switch. In these latter embodiments, the switches may be operated by the control circuit 820 to connect or disconnect impedances between the negative input and output 875 of the sense amp 870, thereby enabling the sense amp 870 to be operated in different modes (e.g., as a transimpedance amplifier or integrator).

The overcurrent protection circuit 835 may include a third transistor 890 coupled between the second electrode 810 and the discharge node 850, and also between the positive input and the negative input of the sense amp 870. The third transistor 890 may be coupled between the second electrode 815 and the discharge node 850 via its source and drain terminals, and may have a control input 895 (e.g., a gate input) configured to receive a signal that causes the third transistor 890 to open or close a current path between the second electrode 815 and the discharge node 850.

By way of example, the first, second, and third transistors 845, 860, 890 are shown to be N channel enhancement type metal oxide semiconductor field effect transistors (MOSFETs). In other examples, the transistors 845, 860, 890 may take other forms.

To charge the piezoelectric body 805 and provide a haptic output, the first transistor 845 may be closed and the second transistor 860 may be opened. While charging the piezoelectric body 805, the third transistor 890 may be closed to provide overcurrent protection for the haptic sensor circuit 830. In some cases, the third transistor 890 may be closed at the same time (and in some cases in response to the same control signal) as the first transistor 845. In other cases, the third transistor 890 may be closed prior to closing the first transistor 845. In still other cases, the third transistor 890 may be closed a predetermined time after closing the first transistor 845, or upon sensing a predetermined current flow into the haptic sensor circuit 830. If the piezoelectric body 805 is charged or discharged at a slow enough rate, the haptic sensor circuit 830 may monitor for haptic input to the piezoelectric body 805 during part or all of the charge time or discharge time. However, when the piezoelectric body 805 is charged or discharged quickly (which is considered typical), the haptic sensor circuit 830 may not monitor for haptic input to the piezoelectric body 805 during part or all of the charge time or discharge time (e.g., charging and sensing operations, or time periods, may be multiplexed).

To discharge the piezoelectric body 805, the second transistor 860 may be closed.

The haptic sensor circuit 830 may monitor for a haptic input to the piezoelectric body 805 by monitoring for an electrical change (e.g., a change in voltage, current, or charge) at the second electrode 815. To monitor for a haptic input, the third transistor 890 may be opened, while either (but not both) of the first and second transistors 845, 860 is closed. The haptic sensor circuit 830 may monitor for a haptic input during times when there is no charge on the piezoelectric body 805 (e.g., after the second transistor 860 has been closed and any charge on the piezoelectric body 805 has been discharged), or when there is a full charge on the piezoelectric body 805 (e.g., after the first transistor 845 has been closed and the piezoelectric body 805 has been fully charged).

Figure 9:
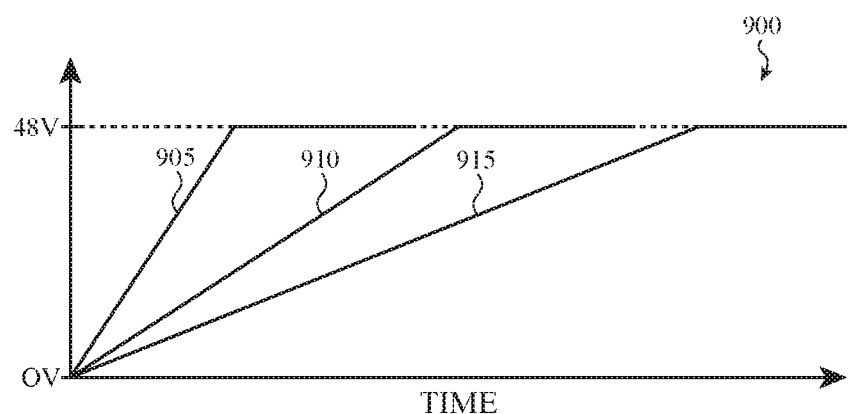
FIG. 9 shows a graph of voltage at the second electrode, over time, for various charging scenarios of the piezoelectric body shown in FIG. 8.

FIG. 9 shows a graph 900 of voltage at the second electrode 815, over time, for various charging scenarios 905, 910, 915 of the piezoelectric body 805 shown in FIG. 8. Under each scenario 905, 910, 915, the voltage ramps up to a steady state high voltage (e.g., 48V). The slope of each charging ramp may determine an intensity of a haptic output. In the first and second scenarios 905, 910, a haptic input may be sensed at a steady state low voltage (e.g., 0V) and at the steady state high voltage, but not during charging of the piezoelectric body, because the rate of charging requires activation of the overcurrent protection circuit 835. In the third scenario 915, the charging ramp may be slow enough that the overcurrent protection circuit 835 does not need to be activated, and a haptic input may be sensed at the steady state low voltage, during charging, and at the steady state high voltage. In scenarios in which the overcurrent protection circuit 835 needs to be employed, the speed of recovering from overcurrent protection may determine the amount of haptic input information loss (e.g., during periods of overcurrent protection) and rate of haptic input information gathering.

Figure 10:
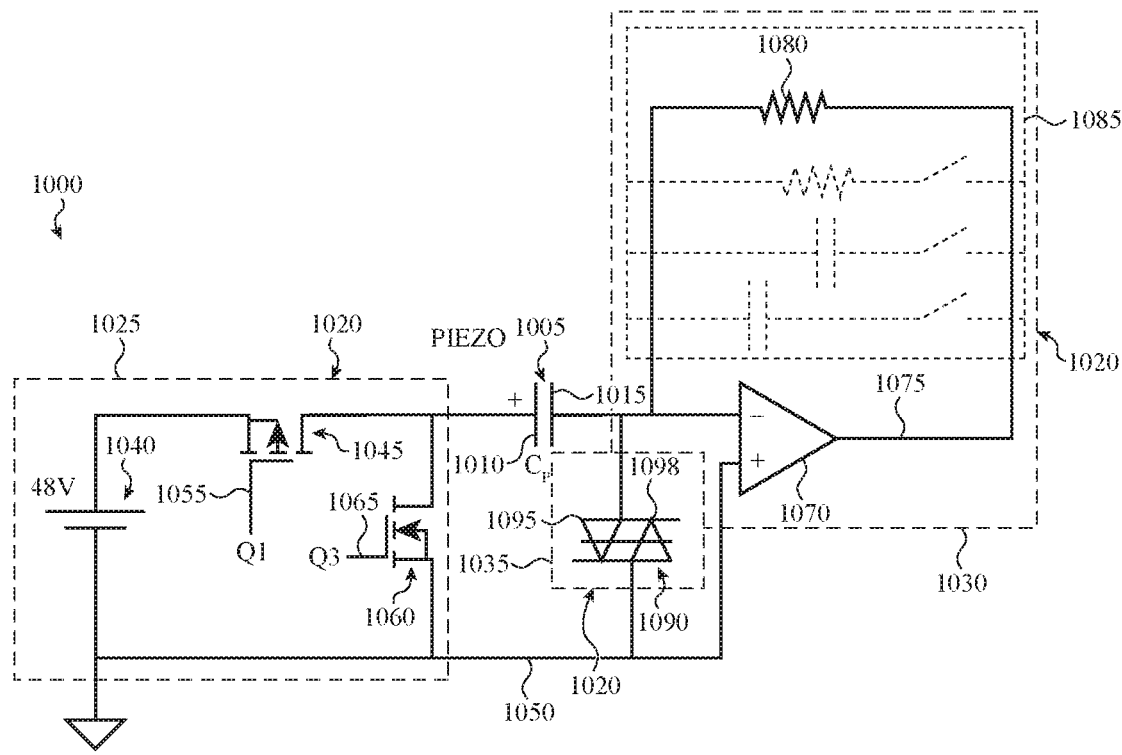
FIG. 10 shows a sample second circuit schematic for a haptic interface.

FIG. 10 shows a sample second circuit schematic 1000 for a haptic interface, such as the haptic interface of FIG. 7. The haptic interface may include a piezoelectric body 1005, a first electrode 1010 coupled to the piezoelectric body 1005, and a second electrode 1015 coupled to the piezoelectric body 1005. By way of example, the piezoelectric body 1005 is depicted as a capacitor $C_P$ having a variable capacitance. In some cases, the piezoelectric body 1005 may represent multiple piezoelectric bodies. The haptic interface may also include a control circuit 1020. The control circuit 1020 may include a haptic actuator circuit 1025, a haptic sensor circuit 1030, and an overcurrent protection circuit 1035.

The haptic actuator circuit 1025 may be coupled to the first electrode 1010 and may be configured to charge the piezoelectric body 1005. The charging may cause the piezoelectric body 1005 to provide a haptic output (e.g., compress, deflect, deform, or otherwise physically change shape). The haptic sensor circuit 1030 may be coupled to the second electrode 1015 and may be configured to sense an electrical change (e.g., a change in voltage, change in current, or change in charge) at the second electrode 1015. The electrical change may be related to a haptic input received by the piezoelectric body 1005. The overcurrent protection circuit 1035 may be coupled to the second electrode 1015 and may be configured to limit a current flow into the haptic sensor circuit 1030 while the haptic actuator circuit 1025 is charging the piezoelectric body 1005.

The haptic actuator circuit 1025 may include a power source 1040 and a first transistor 1045, coupled in series between the first electrode 1010 and a discharge node 1050 (e.g., a ground). By way of example, the power source 1040 is shown to be a 48V power source. In other embodiments, the power source 1040 could supply a higher or lower voltage. The first transistor 1045 may be coupled between the power source 1040 and the first electrode 1010 via its source and drain terminals, and may have a control input 1055 (e.g., a gate input) configured to receive a signal that causes the first transistor 1045 to open or close a current path between the first electrode 1010 and the power source 1040. The haptic actuator circuit 1025 may also include a second transistor 1060 coupled between the first electrode 1010 and the discharge node 1050. The second transistor 1060 may be coupled between the first electrode 1010 and the discharge node 1050 via its source and drain terminals, and may have a control input 1065 (e.g., a gate input) configured to receive a signal that causes the second transistor 1060 to open or close a current path between the first electrode 1010 and the discharge node 1050.

The haptic sensor circuit 1030 may include a sense amp 1070 having a negative input coupled to the second electrode 1010, a positive input coupled to the discharge node 1050, and an output 1075. A resistor 1080 may be coupled between the negative input and the output 1075. The configuration of the sense amp 1070 is that of a transimpedance amplifier, which has no memory and can sense haptic input faster than certain other amplifier configurations. In some embodiments, the resistor 1080 may be part of (or replaced by) a set of impedances 1085. In some embodiments, the set of impedances 1085 may include a number of resistors and capacitors connected in parallel. In some embodiments, one or more (or each) of the parallel-connected impedances may be connected in series with a switch. In these latter embodiments, the switches may be operated by the control circuit 1020 to connect or disconnect impedances between the negative input and output 1075 of the sense amp 1070, thereby enabling the sense amp 1070 to be operated in different modes (e.g., as a transimpedance amplifier or integrator).

The overcurrent protection circuit 1035 may include a clamper circuit 1090 coupled between the second electrode 1015 and the discharge node 1050, and also between the positive input and the negative input of the sense amp 1070. The clamper circuit 1090 may include a forward-biased diode 1095 coupled in parallel with a reverse-biased diode 1098. Parameters of the diodes 1095, 1098 may be configured such that the clamper circuit 1090 automatically limits the current flow into the haptic sensor circuit 1030.

By way of example, the first and second transistors 1045, 1060 are shown to be N channel enhancement type MOSFETs. In other examples, the transistors 1045, 1060 may take other forms.

To charge the piezoelectric body 1005 and provide a haptic output, the first transistor 1045 may be closed and the second transistor 1060 may be opened. While charging the piezoelectric body 1005, the clamper circuit 1090 may automatically conduct to divert at least a portion of the current flow through the second electrode 1015 from into the haptic sensor circuit 1030 to the discharge node 1050, to provide overcurrent protection for the haptic sensor circuit 1030. For example, the clamper circuit 1090 may automatically conduct when the current flow ($I_{CP}$) through the second electrode 1015 exceeds the maximum current ($I_{o\text{-}pamp}$) supported by the sense amp 1070.

To discharge the piezoelectric body 1005, the second transistor 1060 may be closed.

When the clamper circuit 1090 is in an inactive state (e.g., when the piezoelectric body 1005 is charged to a steady-state high voltage or is at a steady-state low voltage), the haptic sensor circuit 1030 may monitor for a haptic input to the piezoelectric body 1005 by monitoring for an electrical change (e.g., a change in voltage, current, or charge) at the second electrode 1015. If the piezoelectric body 1005 is charged or discharged at a slow enough rate, the haptic sensor circuit 1030 may monitor for haptic input to the piezoelectric body 1005 during part or all of the charge time or discharge time. However, when the piezoelectric body 1005 is charged or discharged quickly (which is considered typical), the haptic sensor circuit 1030 may not monitor for haptic input to the piezoelectric body 1005 during part or all of the charge time or discharge time (e.g., charging and sensing operations, or time periods, may be multiplexed).

Figure 11:
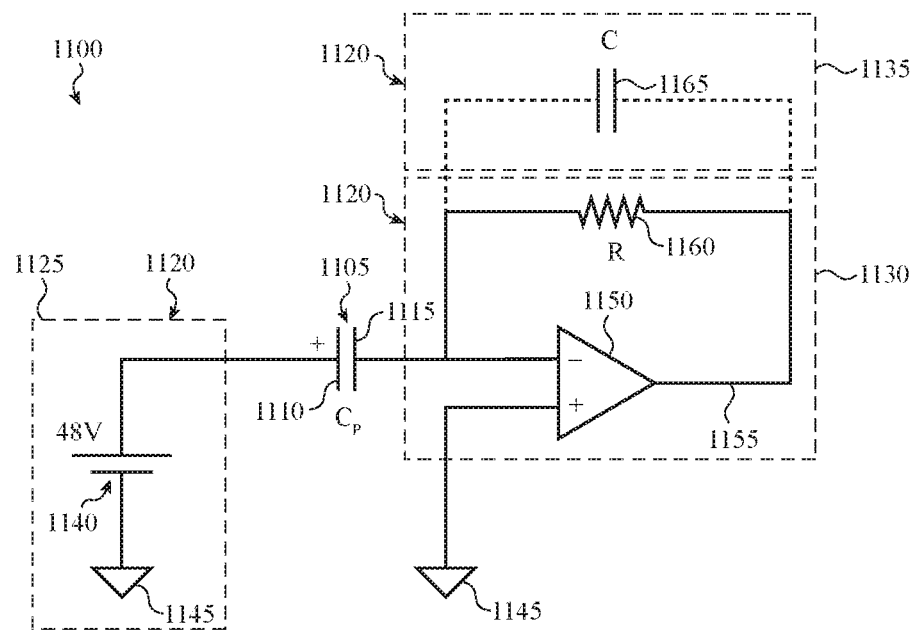
FIG. 11 shows a sample third circuit schematic for a haptic interface.

FIG. 11 shows a sample third circuit schematic 1100 for a haptic interface, such as the haptic interface of FIG. 7. The haptic interface may include a piezoelectric body 1105, a first electrode 1110 coupled to the piezoelectric body 1105, and a second electrode 1115 coupled to the piezoelectric body 1105. By way of example, the piezoelectric body 1105 is depicted as a capacitor $C_P$ having a variable capacitance. In some cases, the piezoelectric body 1105 may represent multiple piezoelectric bodies. The haptic interface may also include a control circuit 1120. The control circuit 1120 may include a haptic actuator circuit 1125, a haptic sensor circuit 1130, and an overcurrent protection circuit 1135.

The haptic actuator circuit 1125 may be coupled to the first electrode 1110 and may be configured to charge the piezoelectric body 1105. The charging may cause the piezoelectric body 1105 to provide a haptic output (e.g., compress, deflect, deform, or otherwise physically change shape). The haptic sensor circuit 1130 may be coupled to the second electrode 1115 and may be configured to sense an electrical change (e.g., a change in voltage, change in current, or change in charge) at the second electrode 1115. The electrical change may be related to a haptic input received by the piezoelectric body 1105. The overcurrent protection circuit 1135 may be coupled to the second electrode 1115, and may be configured to limit a current flow into the haptic sensor circuit 1130 while the haptic actuator circuit 1125 is charging the piezoelectric body 1105.

The haptic actuator circuit 1125 may include a power source 1140 coupled between the first electrode 1110 and a discharge node 1145 (e.g., a ground). By way of example, the power source 1140 is shown to be a 48V power source. In other embodiments, the power source 1140 could supply a higher or lower voltage. In contrast to the haptic interfaces described with reference to FIGS. 8 and 10, the haptic actuator circuit 1125 may maintain the piezoelectric body 1105 in a continually charged state.

The haptic sensor circuit 1130 may include a sense amp 1150 having a negative input coupled to the second electrode 1115, a positive input coupled to the discharge node 1145, and an output 1155. A resistor 1160 may be coupled between the negative input and the output 1155.

The overcurrent protection circuit 1135 may include a charge integration capacitor 1165 coupled between the second electrode 1115 and the output 1155 of the sense amp 1150. The charge integration capacitor 1165 may integrate charge leaked from the piezoelectric body 1105 over time. The charge integration capacitor 1165 may also be used to distinguish a force input to the piezoelectric body 1105 of short duration versus a force input of long duration. The charge on the charge integration capacitor 1165 may be periodically cleared (e.g., reset before performing a new sensing operation) by an integrated charge discharge circuit coupled to the charge integration capacitor 1165. The integrated charge discharge circuit may have a control input configured to receive a control signal that causes the integrated charge discharge circuit to discharge a charge integrated by the charge integration capacitor 1165.

Figure 12:
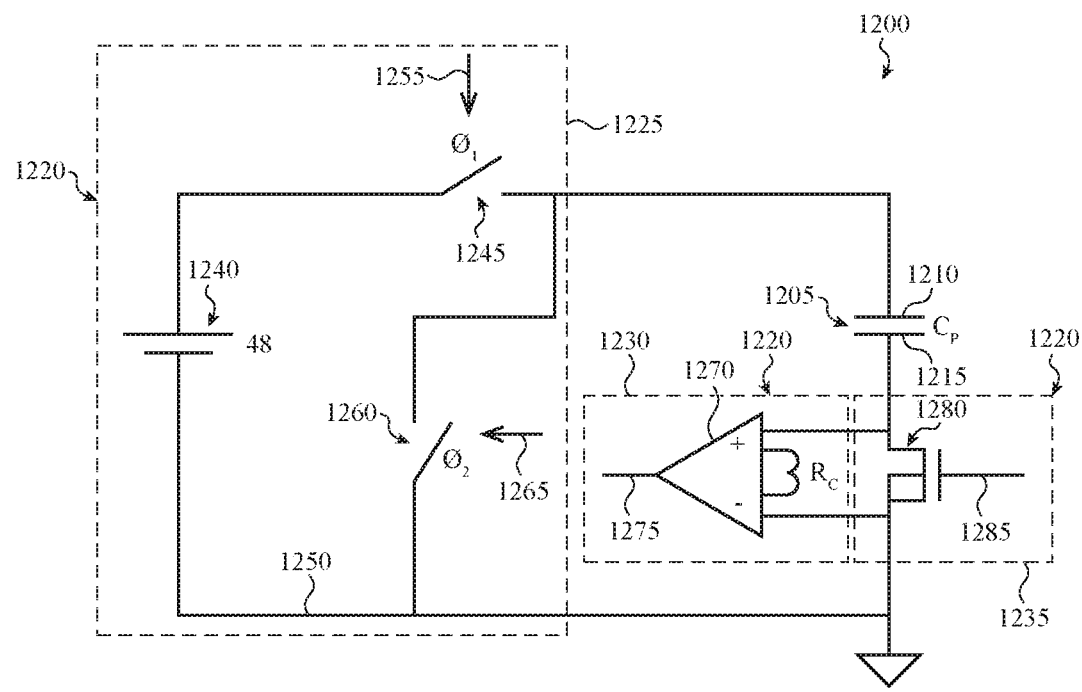
FIG. 12 shows a sample fourth circuit schematic for a haptic interface.

FIG. 12 shows a sample fourth circuit schematic 1200 for a haptic interface, such as the haptic interface of FIG. 7. The haptic interface may include a piezoelectric body 1205, a first electrode 1210 coupled to the piezoelectric body 1205, and a second electrode 1215 coupled to the piezoelectric body 1205. By way of example, the piezoelectric body 1205 is depicted as a capacitor $C_P$ having a variable capacitance. In some cases, the piezoelectric body 1205 may represent multiple piezoelectric bodies. The haptic interface may also include a control circuit 1220. The control circuit 1220 may include a haptic actuator circuit 1225, a haptic sensor circuit 1230, and an overcurrent protection circuit 1235.

The haptic actuator circuit 1225 may be coupled to the first electrode 1210 and may be configured to charge the piezoelectric body 1205. The charging may cause the piezoelectric body 1205 to provide a haptic output (e.g., compress, deflect, deform, or otherwise physically change shape). The haptic sensor circuit 1230 may be coupled to the second electrode 1215 and may be configured to sense an electrical change (e.g., a change in voltage, change in current, or change in charge) at the second electrode 1215. The electrical change may be related to a haptic input received by the piezoelectric body 1205. The overcurrent protection circuit 1235 may be coupled to the second electrode 1215 and configured to limit a current flow into the haptic sensor circuit 1230 while the haptic actuator circuit 1225 is charging the piezoelectric body 1205.

The haptic actuator circuit 1225 may include a power source 1240 and a first transistor 1245, coupled in series between the first electrode 1210 and a discharge node 1250 (e.g., a ground). By way of example, the power source 1240 is shown to be a 48V power source. In other embodiments, the power source 1240 could supply a higher or lower voltage. The first transistor 1245 may be coupled between the power source 1240 and the first electrode 1210 via its source and drain terminals, and may have a control input 1255 (e.g., a gate input) configured to receive a signal that causes the first transistor 1245 to open or close a current path between the first electrode 1210 and the power source 1240. The haptic actuator circuit 1225 may also include a second transistor 1260 coupled between the first electrode 1210 and the discharge node 1250. The second transistor 1260 may be coupled between the first electrode 1210 and the discharge node 1250 via its source and drain terminals, and may have a control input 1265 (e.g., a gate input) configured to receive a signal that causes the second transistor 1260 to open or close a current path between the first electrode 1210 and the discharge node 1250.

The haptic sensor circuit 1230 may include a sense amp 1270 having a positive input coupled to the second electrode 1215, a negative input coupled to the discharge node 1250, and an output 1275.

The overcurrent protection circuit 1235 may include a third transistor 1280 coupled between the second electrode 1215 and the discharge node 1250, and also between the positive input and the negative input of the sense amp 1270. The third transistor 1280 may be coupled between the second electrode 1215 and the discharge node 1250 via its source and drain terminals, and may have a control input 1285 (e.g., a gate input) configured to receive a signal that causes the third transistor 1280 to open or close a current path between the second electrode 1215 and the discharge node 1250.

The first, second, and third transistors may take various forms.

To charge the piezoelectric body 1205 and provide a haptic output, the first transistor 1245 may be closed and the second transistor 1260 may be opened. While charging the piezoelectric body 1205, the third transistor 1280 may be closed to provide overcurrent protection for the haptic sensor circuit 1230. In some cases, the third transistor 1280 may be closed at the same time (and in some cases in response to the same control signal) as the first transistor 1245. In other cases, the third transistor 1280 may be closed prior to closing the first transistor 1245. In still other cases, the third transistor 1280 may be closed a predetermined time after closing the first transistor 1245, or upon sensing a predetermined current flow into the haptic sensor circuit 1230.

To discharge the piezoelectric body 1205, the second transistor 1260 may be closed.

The haptic sensor circuit 1230 may monitor for a haptic input to the piezoelectric body 1205 by monitoring for an electrical change (e.g., a change in voltage, current, or charge) at the second electrode 1215. To monitor for a haptic input, the third transistor 1280 may be opened, while either (but not both) of the first and second transistors 1245, 1260 is closed. The haptic sensor circuit 1230 may monitor for a haptic input during times when there is no charge on the piezoelectric body 1205 (e.g., after the second transistor 1260 has been closed and any charge on the piezoelectric body 1205 has been discharged), but not at times when there is a full charge on the piezoelectric body 1205 (e.g., after the first transistor 1245 has been closed and the piezoelectric body 1205 has been fully charged).

Figure 13:
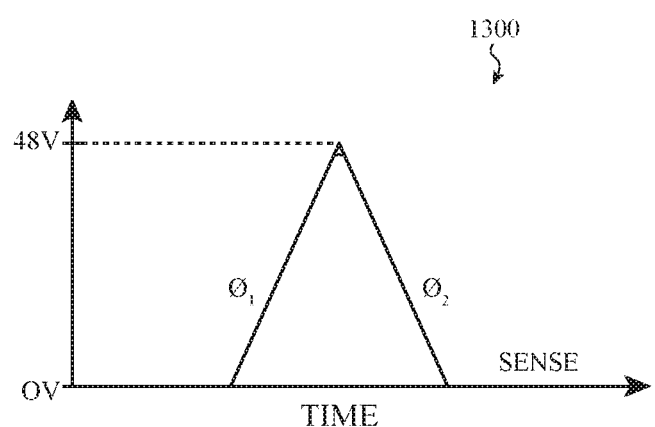
FIG. 13 shows a graph of voltage at the second electrode, over time, for various charging scenarios of the piezoelectric body shown in FIG. 12.

FIG. 13 shows a sample graph 1300 of voltage at the second electrode 1215, over time, for the piezoelectric body 1205 shown in FIG. 12. When charging the piezoelectric body 1205 to provide a haptic output (by asserting the $\phi_{1i}$ control signal), the voltage ramps up to a steady state high voltage (e.g., 48V). After charging the piezoelectric body 1205, the piezoelectric body 1205 needs to be discharged (by asserting the $\phi_2$ control signal) before monitoring for a haptic input (e.g., at 0V).

Figure 14:
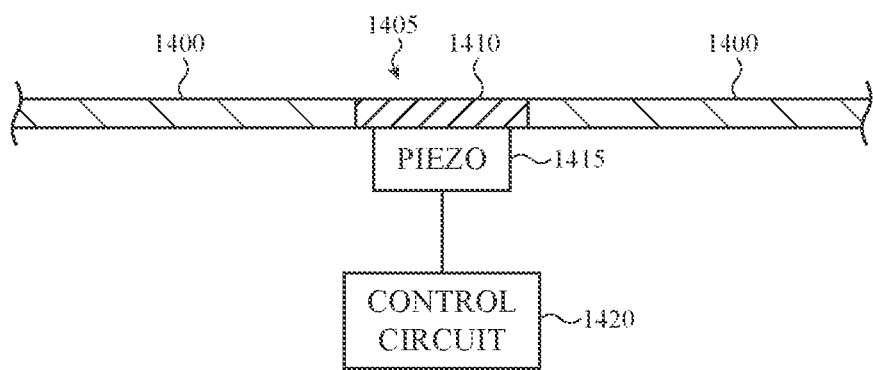
FIGS. 14 and 15 show electronic devices that may incorporate haptic interfaces.

FIG. 14 shows a surface 1400 of an electronic device that may incorporate a haptic interface 1405 such as one of the haptic interfaces described with reference to FIG. 1, 7, 8, 10, 11, or 12. In some examples, the electronic device 1400 may be a smartphone, a tablet computer, or a wearable device (e.g., a watch).

In some embodiments, the surface 1400 may be part of a light-emitting display or a surface surrounding a light-emitting display. In some embodiments, the haptic interface 1405 may be part of a movable or generally immovable button 1410, which button 1410 has a fixed or movable (e.g., virtual) location on the surface 1400. In some embodiments, the haptic interface 1405 may be part of a keyboard (e.g., part of a key) on the surface 1400, which keyboard may be have movable or generally immovable keys. In some embodiments, the haptic interface 1405 may include a movable pin in place of the button 1410, or the button 1410 may include a movable pin (not shown). The haptic interface 1405 may include a piezoelectric body 1415, and a control circuit 1420 such as one of the control circuits described with reference to FIG. 8, 10, 11, or 12. The control circuit 1420 may configure the haptic interface 1405 as a haptic sensor (e.g., to sense a force input provided by a user of the electronic device), a haptic actuator (e.g., to provide a tactile output), or both simultaneously, as described in this disclosure. In some cases, the piezoelectric body 1415 may sense a force input while the piezoelectric body 1415 is charged or actuated and/or when the piezoelectric body 1415 is not charged or actuated.

Figure 15:
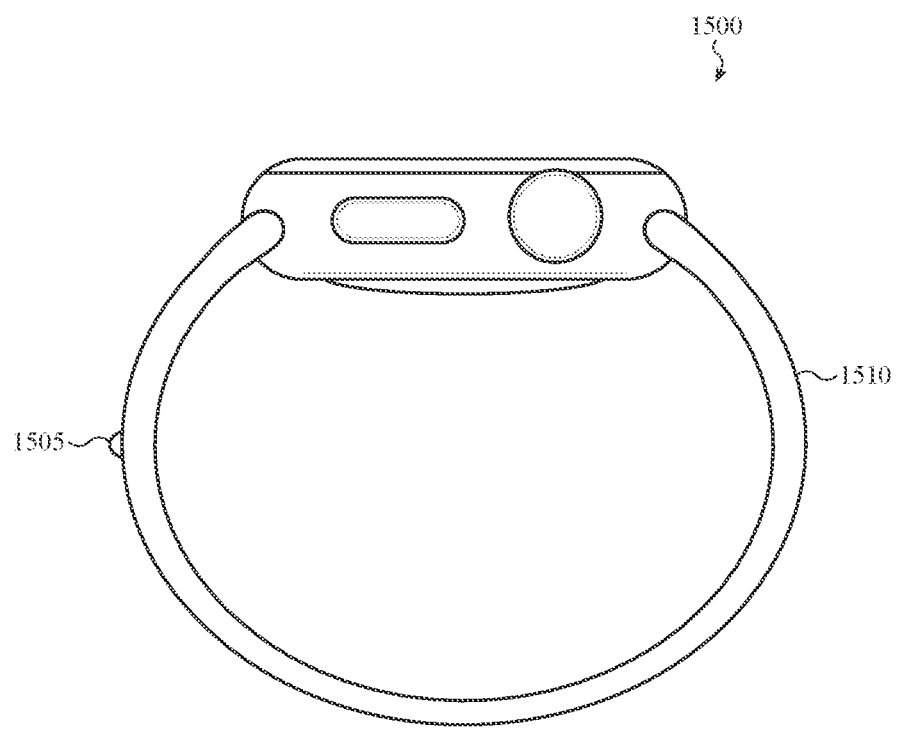

FIG. 15 shows an electronic device 1500 that may incorporate a haptic interface such as one of the haptic interfaces described with reference to FIG. 1, 7, 8, 10, 11, or 12. By way of example, the electronic device 1500 is shown to be a watch, though the electronic device 1500 could take other wearable forms or be a different type of electronic device (e.g., a non-wearable electronic device).

The electronic device 1500 may include a haptic interface 1505 that is usable by the electronic device 1500 as a notifier (e.g., an alarm or reminder) or presence sensor (e.g., a haptic prompt to inquiry whether a user is still engaged in an activity (e.g., exercising or performing a task) or still engaged with an application or utility running on the electronic device 1500 (e.g., a stopwatch utility)). In some examples, the haptic interface 1505 may include a piezoelectric body that is capable of providing a haptic output (e.g., a raised bump or pin). As shown, the haptic interface 1505 may be provided on an exterior surface of a smart watch band 1510. Alternatively, the haptic interface 1505 may be provided on an interior surface of the smart watch band 1510, or at another location on the electronic device 1500. In some examples, the piezoelectric body may be associated with one of the control circuits described with reference to FIG. 7, 8, 10, 11, or 12.

The haptic interface 1505 may sense a force input when it is actuated (e.g., when a piezoelectric body of the haptic interface 1505 is charged). In the case of an alarm or reminder, a user's force input to the haptic interface 1505 may cause the electronic device to clear the alarm or reminder (e.g., discharge a piezoelectric body or otherwise discontinue the haptic output).

Figure 16:
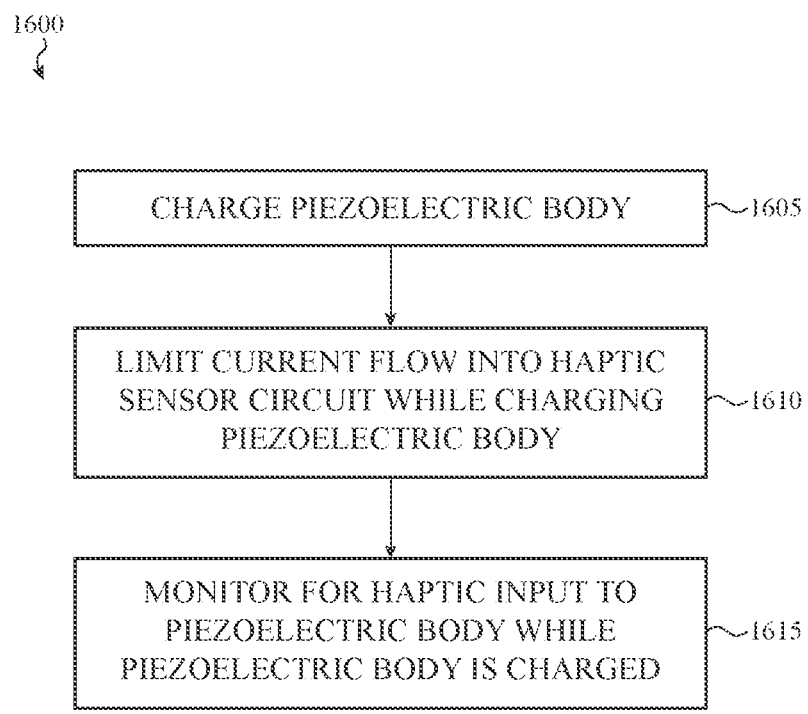
FIGS. 16 and 17 show methods of operating a haptic interface.

Referring now to FIG. 16, there is shown a method 1600 of operating a haptic interface. In some examples, the method 1600 may be performed by an electronic device, such as the electronic device described with reference to FIG. 1, 14, or 15.

At 1605, the method 1600 may include charging a piezoelectric body of the haptic interface to deliver a haptic output. The operation(s) at 1605 may be performed, for example, by the haptic actuator circuit described with reference to FIG. 8, 10, 11, or 12.

At 1610, the method 1600 may include limiting a current flow into a haptic sensor circuit while charging the piezoelectric body. The operation(s) at 1610 may be performed, for example, by the overprotection circuit described with reference to FIG. 8, 10, 11, or 12.

At 1615, the method 1600 may include monitoring for a haptic input to the piezoelectric body using the haptic sensor circuit while the piezoelectric body is charged. The operation(s) at 1615 may be performed, for example, by the haptic sensor circuit described with reference to FIG. 8, 10, 11, or 12.

In some examples, the method 1600 may include monitoring for a haptic input prior to charging the piezoelectric body and/or while charging the piezoelectric body.

In some examples, limiting the current flow into the haptic sensor circuit may include diverting at least a portion of the current flow from into the haptic sensor circuit to a discharge node. In some examples, diverting at least a portion of the current flow from into the haptic sensor circuit to the discharge node may include applying a control signal to a transistor. The transistor may be coupled between a first input and a second input of the haptic sensor circuit. Also, the first input may be coupled to an electrode attached to the piezoelectric body, and the second input may be coupled to the discharge node. In other examples, diverting at least a portion of the current flow from into the haptic sensor circuit to the discharge node may include automatically diverting at least the portion of the current flow based on a parameter of a diode.

In some examples, limiting the current flow into the haptic sensor circuit may include integrating a charge using a charge integrator (e.g., a capacitor) coupled between an input of the haptic sensor circuit and an output of the haptic sensor circuit, and clearing the integrated charge before monitoring for the haptic input.

Figure 17:
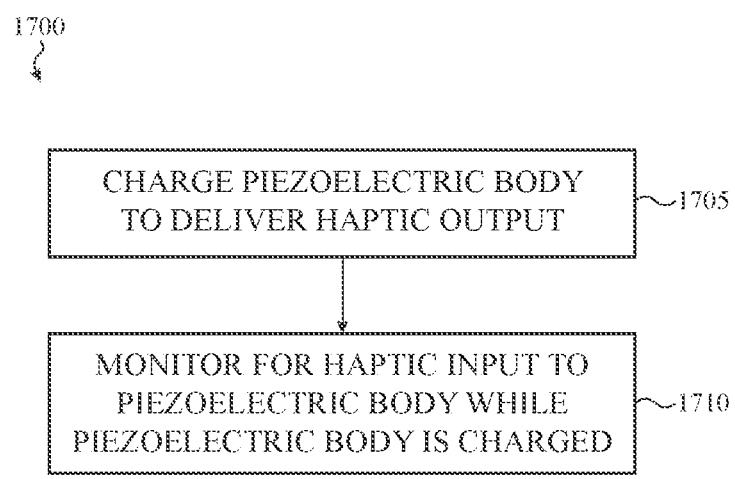

FIG. 17 shows another method 1700 of operating a haptic interface. In some examples, the method 1700 may be performed by an electronic device, such as the electronic device described with reference to FIG. 1, 14, or 15.

At 1705, the method 1700 may include charging a piezoelectric body of the haptic interface to deliver a haptic output. The operation(s) at 1705 may be performed, for example, by the haptic actuator circuit described with reference to FIG. 8, 10, 11, or 12.

At 1710, the method 1700 may include monitoring for a haptic input to the piezoelectric body while the piezoelectric body is charged. The operation(s) at 1710 may be performed, for example, by the haptic sensor circuit described with reference to FIG. 8, 10, 11, or 12.

Figure 18:
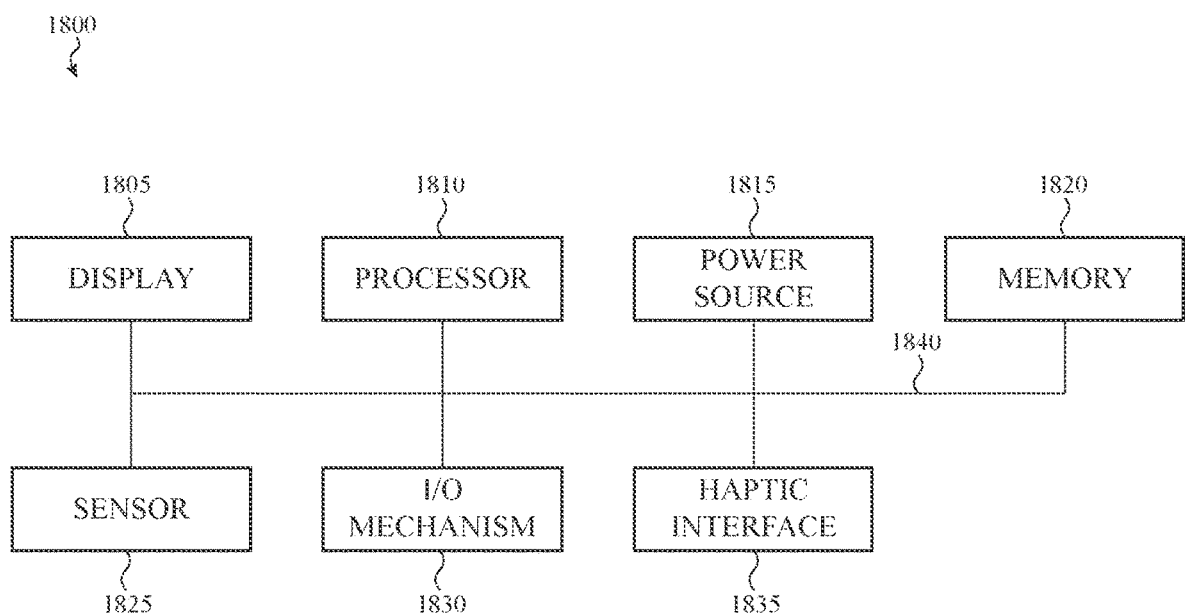
FIG. 18 shows a sample electrical block diagram of an electronic device.

FIG. 18 shows a sample electrical block diagram of an electronic device 1800, which may be an example block diagram of the electronic device described with reference to FIG. 1, 14, or 15. The electronic device 1800 can include a display 1805 (e.g., a light-emitting display), a processor 1810, a power source 1815, a memory 1820 or storage device, a sensor 1825, an input/output (I/O) mechanism 1830 (e.g., an input/output device and/or input/output port), and a haptic interface 1835. The processor 1810 can control some or all of the operations of the electronic device 1800. The processor 1810 can communicate, either directly or indirectly, with substantially all of the components of the electronic device 100. For example, a system bus or other communication mechanism 1840 can provide communication between the processor 1810, the power source 1815, the memory 1820, the sensor 1825, the input/output mechanism 1830, and/or the haptic interface 1835.

The processor 1810 can be implemented as any electronic device capable of processing, receiving, or transmitting data or instructions. For example, the processor 1810 can be a microprocessor, a central processing unit (CPU), an application-specific integrated circuit (ASIC), a digital signal processor (DSP), or combinations of such devices. As described herein, the term "processor" is meant to encompass a single processor or processing unit, multiple processors, multiple processing units, or other suitably configured computing element or elements.

It should be noted that the components of the electronic device 1800 can be controlled by multiple processors. For example, select components of the electronic device 1800 may be controlled by a first processor and other components of the electronic device 1800 may be controlled by a second processor, where the first and second processors may or may not be in communication with each other.

The power source 1815 can be implemented with any device capable of providing energy to the electronic device 1800. For example, the power source 1815 may be one or more batteries or rechargeable batteries. Additionally or alternatively, the power source 1815 can be a power connector or power cord that connects the electronic device 1800 to another power source, such as a wall outlet.

The memory 1820 can store electronic data that can be used by the electronic device 1800. For example, the memory 1820 can store electrical data or content such as, for example, audio and video files, documents and applications, device settings and user preferences, timing signals, control signals, and data structures or databases. The memory 1820 can be configured as any type of memory. By way of example only, the memory 1820 can be implemented as random access memory, read-only memory, Flash memory, removable memory, other types of storage elements, or combinations of such devices.

The electronic device 1800 may also include one or more sensors 1825 positioned substantially anywhere on the electronic device 1800. The sensor(s) 1825 can be configured to sense substantially any type of characteristic, such as but not limited to, pressure, light, touch, heat, movement, relative motion, biometric data, and so on. For example, the sensor(s) 1825 may include a heat sensor, a position sensor, a light or optical sensor, an accelerometer, a pressure transducer, a gyroscope, a magnetometer, a health monitoring sensor, and so on. Additionally, the one or more sensors 1825 can utilize any suitable sensing technology, including, but not limited to, capacitive, ultrasonic, resistive, optical, ultrasound, piezoelectric, and thermal sensing technology.

The 110 mechanism 1830 can transmit and/or receive data from a user or another electronic device. An 110 device can include a display, a touch sensing input surface such as a track pad, one or more buttons (e.g., a graphical user interface "home" button), one or more cameras, one or more microphones or speakers, one or more ports such as a microphone port, and/or a keyboard. Additionally or alternatively, an 110 device or port can transmit electronic signals via a communications network, such as a wireless and/or wired network connection. Examples of wireless and wired network connections include, but are not limited to, cellular, Wi-Fi, Bluetooth, IR, and Ethernet connections.

The haptic interface 1835 may be operably connected to the processor 1810, display 1805, or other components of the electronic device 1800. The haptic interface 1835 may provide the processor 1810 a signal corresponding to compression, deflection, deformation, or other movement of one or more piezoelectric bodies of the haptic interface 1835, and the processor 1810 may wake up a portion of the electronic device 1800, manipulate a graphical element on the display 1805 of the electronic device 1800, or perform another operation in response to the signal. The processor 1810 may also activate the haptic interface 1835 to solicit a user's attention, enhance the user's interaction experience with the electronic device 1800, displace the electronic device 1800 or a component of the electronic device 1800, or provide any other suitable notification or user experience. The haptic interface 1835 may be activated, for example, by generating a signal that causes one or more piezoelectric bodies of the haptic interface 1835 to compress, deflect, deform, or otherwise physically change. The haptic interface 1835 may also function as a sensor 1825, and may receive force input from a user of the electronic device 1800.

The foregoing description, for purposes of explanation, uses specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

What is claimed is:

1. A haptic interface, comprising:
    a piezoelectric body;
    a first electrode coupled to the piezoelectric body;
    a second electrode coupled to the piezoelectric body; and
    a control circuit, comprising:
        a haptic actuator circuit coupled to the first electrode and configured to charge the piezoelectric body, the charging causing the piezoelectric body to provide a haptic output;
        a haptic sensor circuit coupled to the second electrode and configured to sense an electrical change at the second electrode, the electrical change related to a haptic input received by the piezoelectric body; and
        an overcurrent protection circuit coupled to the second electrode and configured to limit a current flow into the haptic sensor circuit while the haptic actuator circuit is charging the piezoelectric body.

2. The haptic interface of claim 1, wherein the overcurrent protection circuit comprises:
    a transistor coupled between the second electrode and a discharge node, the transistor having a control input configured to receive a signal that causes the transistor to open or close a current path between the second electrode and the discharge node.

3. The haptic interface of claim 1, wherein the overcurrent protection circuit comprises:
    a clamper circuit coupled between the second electrode and a discharge node.

4. The haptic interface of claim 3, wherein the clamper circuit comprises a forward-biased diode coupled in parallel with a reverse-biased diode.

5. The haptic interface of claim 1, wherein the haptic sensor circuit comprises a sense amp, the sense amp comprising a negative input coupled to the second electrode and a positive input coupled to a discharge node.

6. The haptic interface of claim 5, wherein the overcurrent protection circuit is coupled between the negative input and the positive input of the sense amp, and the positive input of the sense amp is coupled to the discharge node.

7. The haptic interface of claim 5, wherein the overcurrent protection circuit comprises:
    a transistor coupled between the negative input and the positive input of the sense amp, the transistor having a control input configured to receive a control signal that causes the transistor to open or close a current path between the negative input and the positive input of the sense amp,
    wherein the positive input of the sense amp is further coupled to the discharge node.

8. The haptic interface of claim 7, wherein the haptic actuator circuit comprises:
    a second transistor coupled between the first electrode and a power source, the second transistor having a second control input configured to receive a second control signal that causes the second transistor to open or close a second current path between the first electrode and the power source; and
    a third transistor coupled between the first electrode and the discharge node, the transistor having a third control input configured to receive a third control signal that causes the third transistor to open or close a third current path between the first electrode and the discharge node.

9. The haptic interface of claim 5, wherein the overcurrent protection circuit comprises:
    a charge integration capacitor coupled between the negative input of the sense amp and an output of the sense amp.

10. The haptic interface of claim 9, further comprising:
    an integrated charge discharge circuit coupled to the charge integration capacitor, the integrated charge discharge circuit having a control input configured to receive a control signal that causes the integrated charge discharge circuit to discharge a charge integrated by the charge integration capacitor.

11. The haptic interface of claim 5, further comprising:
a digital sampling circuit coupled to an output of the sense amp.

12. A haptic interface, comprising:
a piezoelectric body;
a first electrode coupled to the piezoelectric body;
a second electrode coupled to the piezoelectric body; and
a control circuit, comprising:
   a haptic actuator circuit coupled to the first electrode and configured to maintain a charge on the piezoelectric body, the charge causing the piezoelectric body to provide a haptic output; and
   a haptic sensor circuit coupled to the second electrode and configured to sense an electrical change at the second electrode while the piezoelectric body is charged, the electrical change related to a haptic input received by the piezoelectric body.

13. A method of operating a haptic interface, comprising:
charging a piezoelectric body of the haptic interface to deliver a haptic output;
limiting a current flow into a haptic sensor circuit while charging the piezoelectric body; and
monitoring for a haptic input to the piezoelectric body using the haptic sensor circuit while the piezoelectric body is charged;
wherein limiting the current flow into the haptic sensor circuit comprises diverting at least a portion of the current flow from into the haptic sensor circuit to a discharge node.

14. The method of claim 13, further comprising:
monitoring for the haptic input while charging the piezoelectric body.

15. The method of claim 13, wherein diverting at least the portion of the current flow from into the haptic sensor circuit to the discharge node comprises:
applying a control signal to a transistor.

16. The method of claim 15, wherein the transistor is coupled between a first input and a second input of the haptic sensor circuit.

17. The method of claim 16, wherein the first input is coupled to an electrode attached to the piezoelectric body, and the second input is coupled to the discharge node.

18. The method of claim 13, wherein diverting at least the portion of the current flow from into the haptic sensor circuit to the discharge node comprises:
automatically diverting at least the portion of the current flow based on a parameter of a diode.

* * * * *